United States Patent [19]
Sakaguchi et al.

[11] Patent Number: 5,840,616
[45] Date of Patent: Nov. 24, 1998

[54] METHOD FOR PREPARING SEMICONDUCTOR MEMBER

[75] Inventors: Kiyofumi Sakaguchi; Takao Yonehara, both of Atsugi, Japan

[73] Assignee: Canon Kabushiki Kaisha, Tokyo, Japan

[21] Appl. No.: 525,246

[22] Filed: Sep. 8, 1995

Related U.S. Application Data

[63] Continuation of Ser. No. 133,784, Oct. 8, 1993, abandoned, which is a continuation of Ser. No. 886,609, May 21, 1992, abandoned.

[30] Foreign Application Priority Data

| | | | |
|---|---|---|---|
| May 22, 1991 | [JP] | Japan | 3-145286 |
| May 24, 1991 | [JP] | Japan | 3-148162 |
| May 27, 1991 | [JP] | Japan | 3-149303 |
| May 27, 1991 | [JP] | Japan | 3-149304 |
| May 27, 1991 | [JP] | Japan | 3-149305 |
| May 28, 1991 | [JP] | Japan | 3-150986 |
| May 28, 1991 | [JP] | Japan | 3-150987 |
| May 28, 1991 | [JP] | Japan | 3-150988 |
| May 29, 1991 | [JP] | Japan | 3-152252 |

[51] Int. Cl.$^6$ ................................... H01L 21/76
[52] U.S. Cl. ................. 438/459; 438/466; 438/960; 438/977
[58] Field of Search ................ 437/62, 86, 126, 437/938, 966, 974; 148/DIG. 12, DIG. 135; 438/459, 466, 960, 977

[56] References Cited

U.S. PATENT DOCUMENTS

| | | |
|---|---|---|
| 4,771,016 | 9/1988 | Bajor et al. |
| 4,878,957 | 11/1989 | Yamagachi et al. |
| 4,891,329 | 1/1990 | Reisman et al. |
| 4,939,101 | 7/1990 | Black et al. |
| 5,371,037 | 12/1994 | Yonehara . |

FOREIGN PATENT DOCUMENTS

| | | | |
|---|---|---|---|
| 0469630 | 2/1992 | European Pat. Off. | H01L 21/76 |
| 0499488 | 8/1992 | European Pat. Off. | H01L 21/306 |
| 342814 | 2/1991 | Japan . | |
| 3109731 | 5/1991 | Japan . | |
| 2206548 | 8/1991 | Japan . | |
| 479209 | 3/1992 | Japan . | |

OTHER PUBLICATIONS

Takai, H., et al "Power Silicon . . . Structure", J. Appl. Phys. 60(1) Jul. 1986 pp. 222–225.

Haisma, J., "Silicon On Insulator . . . Evaluations", J. Journal of Appl. Phys, vol. 28, No. 8 (1989) pp. 1426–1443.

Japanese Journal of Applied Physics, vol. 28, No. 8, Part 1, 1988, pp. 1426–1443, J. Haisma et al., "Silicon–on–Insulator Wafer Bonding–Wafer Thinning Technological Evaluations".

Patent Abstracts of Japan, vol. 4, No. 44, (E–005) May 4, 1980 (& JP–A–55016464–NEC Corp.).

Hamaguchi, et al., Japanese Journal of Applied Physics, Part II, "Device Layer Transfer Techn. using Chemi–Mechanical Polishing", vol. 23, No. 10 (Oct. 1984), pp. L815–L817.

Vescan, et al., Materials Letters, "Low–Pressure Vapor–Phase Epitaxy Of Of Silicon On Porous Silicon", vol. 7, No. 3 (Sep. 1988), pp. 94–98.

(List continued on next page.)

Primary Examiner—George R. Fourson
Attorney, Agent, or Firm—Fitzpatrick, Cella, Harper & Scinto

[57] ABSTRACT

A method for preparing a semiconductor member comprises process of making a porous Si substrate and then forming a non-porous Si monocrystalline layer on the porous Si substrate; primary bonding process of bonding the porous Si substrate and an insulating substrate via the non-porous Si monocrystalline layer; etching process of etching the porous Si to remove the porous Si by chemical etching after the primary bonding process; and secondary bonding process of strengthening the primary bonding after the etching process.

24 Claims, 8 Drawing Sheets

OTHER PUBLICATIONS

Canham, Appl. Phys. Lett., "Silicon Quantum Wire Array Fabrication By Electrochemical And Chemical Dissolution Of Wafers", vol. 57, No. 10 (Sep. 3, 1990), pp. 1046–1048.

Tu, Journal of the Electrochemical Society, "Fabrication of Silicon Microstructures Based on Selective Formation and Etching of Porous Silicon", vol. 135, No. 8 (Aug. 1988), pp. 2105–2107.

"Single–Crystal Silicon On Non–Single–Crystal Insulators," edited by G.W. Cullen, *Journal of Crystal Growth*, vol. 63, No. 3, Oct. 11, 1983, pp. 429–590.

K. Imai et al., "Crystalline Quality of Silicon Layer Formed by FIPOS Technology," *Journal of Crystal Growth*, vol. 63, No. 3, Oct. 11, 1983, pp. 547–553.

A. Uhlir, Jr., "Electrolytic Shaping of Germanium," *The Bell System Technical Journal*, vol. 35, Nov. 9, 1955, pp. 333–347.

T. Unagami, "Formation Mechanism of Porous Silicon Layer by Anodization in HF Solution," *Journal of the Electrochemical Society*, vol. 127, No. 2, pp. 476–483, Feb. 1980.

K. Imai, "A New Dielectric Isolation Method Using Porous Silicon," *Solid State Electronics*, vol. 24, No. 2, Feb. 1981, pp. 159–164.

R.P. Holmstrom et al., "Complete dielectric isolation by highly sensitive and self–stopping formation of oxidized porous silicon," *Applied physics Letters*, vol. 42, No. 4, Feb. 15, 1983, pp. 386–388.

METHOD FOR PREPARING SEMICONDUCTOR MEMBER

This application is a continuation of application Ser. No. 08/133,784 filed Oct. 8, 1993, which is a continuation of application Ser. No. 07/866,609 filed May 21, 1992, both now abandoned.

BACKGROUND OF THE INVENTION

1. Field of the Invention

The present invention relates to a method of producing a semiconductor member. And more particularly, it relates to a method of producing a semiconductor member which is suitable for separation of dielectric materials or electronic devices, integrated circuits prepared on a monocrystalline semiconductor layer on an insulating material.

2. Related Background Art

Formation of a monocrystalline Si semiconductor layer on an insulating material has been widely known as the silicon on insulator (SOI) technology, and since a large number of advantages which cannot be reached by bulk Si substrates for preparation of conventional Si integrated circuits are possessed by the device utilizing the SOI structure, so many researches have been made. More specifically, by utilizing the SOI structure, the following advantages can be obtained:

1. Dielectric isolation can be easily done to enable high degree of integration;
2. Radiation hardness is excellent;
3. Stray capacity is reduced to attain high speed;
4. Well formation step can be omitted;
5. Latch-up can be prevented;
6. Fully depleted field effect transistor can be made by thin film formation.

In order to realize the many advantages in device characteristics as mentioned above, studies have been made about the method for forming the SOI structure for the past 10 years. The contents are summarized in, for example, the literature as mentioned below:

Special Issue: "Single-crystal silicon on non-single-crystal insulators"; edited by G. W. Cullen, Journal of Crystal Growth, Volume 63, No. 3, pp.429–590 (1983).

Also, it has been known for a long time to form the SOS (silicon on sapphire) structure by heteroepitaxy of Si on a monocrystalline sapphire substrate by CVD (chemical vapor deposition) method. This was successful to some extent as the most mature SOI technique, but for such reasons as a large amount of crystal defects because of lattice mismatching at the interface between the Si layer and the sapphire substrate, introduction of aluminum from the sapphire substrate into the Si layer, and above all the high cost of the substrate and delay in enlargement of the substrate wafer size, it is unsuitable for being widely applied. Relatively recent attempts to realize the SOI structure without use of a sapphire substrate have been done. Such attempts may be broadly classified into the two shown below:

(1) After surface oxidation of an Si monocrystalline substrate, a window is formed to have the Si substrate partially exposed, and epitaxial growth is processed in the lateral direction with that exposed portion as the seed to form an Si monocrystalline layer on $SiO_2$. (In this case, deposition of Si layer on $SiO_2$ is accompanied.)

(2) By use of an Si monocrystalline substrate itself as an active layer, $SiO_2$ is formed therebeneath. (This method is accompanied with no deposition of Si layer.)

As the means for realizing the above (1), there have been known the method in which a monocrystalline Si layer is formed directly to lateral epitaxial growth by CVD, the method in which amorphous Si is deposited and subjected to solid phase lateral epitaxial growth by heat treatment, the method in which an amorphous or polycrystalline Si layer is irradiated convergently with an energy beam such as electron beam, laser beam, etc. and a monocrystalline layer is grown on $SiO_2$ by melting and recrystallization, and the method in which a melting region is scanned in a zone fashion by a rod-shaped heater (Zone melting recrystallization). These methods have both advantages and disadvantages, they still have many problems with respect to controllability, productivity, uniformity and quality, and none of them have been industrially applied yet up to date. For example, the CVD method requires sacrificial-oxidation in flat thin film formation, while the crystallinity is poor in the solid phase growth method. On the other hand, in the beam annealing method, problems are involved in controllability such as treatment time by converged beam scanning, the manner of overlapping of beams, focus adjustment, etc. Among these, the Zone Melting Recrystallization method is the most mature, and a relatively larger scale integrated circuit has been experimentally made, but still a large number of crystal defects such as sub-boundary remain, and no device driven by minority carriers has been prepared.

Concerning the method using no Si substrate as the seed for epitaxial growth which is the above method (2), for example, the following methods may be included.

1. An oxide film is formed on an Si monocrystalline substrate with V-grooves as anisotropically etched on the substrate, a polycrystalline Si layer is deposited on the oxide film as the Si substrate, and thereafter by polishing from the back surface of the Si substrate, Si monocrystalline regions dielectrically separated by surrounding with the V-grooves on the thick polycrystalline Si layer are formed. In this method, although crystallinity is good, there are problems with respect to controllability and productivity in the step of depositing the polycrystalline Si with is a thickness of some hundred microns and the step in which the monocrystalline Si substrate is polished from the back surface to leave only the Si active layer as separated.

2. This is the method called SIMOX (Separation by ion-implanted oxygen) in which as $SiO_2$ layer is formed by ion implantation of oxygen into an Si monocrystalline substrated, which is one of the most mature methods because of good matching with the Si—IC (Integrated Circuit) process. However, for formation of the $SiO_2$ layer, $10^{18}$ ions/cm$^2$ or more of oxygen ions are required to be implanted, and the implantation time is very long and not high in productivity, and also the wafer cost is high. further, many crystal defects remain, and from an industrial point of view, no sufficient level of quality capable of preparing a device driven by minority carriers has been attained.

3. This is the method to form an SOI structure by dielectric isolation according to oxidation of porous SI. This is a method in which an N-type Si layer is formed on the surface of a P-type Si monocrystalline substrate in the shape of islands by way of proton ion implantation (Imai et al., J. Crystal Growth, Vol. 63, 547 (1983)), or by epitaxial growth and patterning; only the P-type Si substrate is made porous by anodization in HF solution so as to surround the Si islands from the surface; and then the N-type Si islands are dielectrically isolated by accelerated oxidation. In this method, the separated Si region is determined before the device steps, whereby there is the problem that the degree of freedom in device circuit design may be limited in some cases.

A light-transparent substrate is important for forming a contact sensor serving as a light-receiving device and a projection-type liquid crystal image display. A high-quality driving device is required for further increasing the density, resolution and definition of the pixels (picture element) of such a sensor or display. It is consequently necessary to produce a device to be provided on a light-transparent substrate by using a monocrystalline layer having excellent crystallinity.

However, if an Si layer is deposited on a light-transparent substrate such as glass substrate, etc., the Si layer is generally an amorphous layer or, at best, a polycrystalline layer because the Si layer reflects the disorder of the crystal structure of the substrate, and no high-quality device can thus be formed by using the Si layer. This is because the substrate has an amorphous crystal structure, and thus a monocrystalline layer of high quality cannot be easily obtained by simply depositing the Si layer.

A method of obtaining a good SOI layer is known in which an Si monocrystalline substrate is bonded onto another Si monocrystalline substrate, which is thermally oxidized, with heat treatment to form an SOI structure.

Takao Yonehara, one of the inventors, previously proposed a method of forming a semiconductor substrate which is capable of solving the above problems in Japanese Patent Application No. 2-206548.

The method of forming a semiconductor substrate disclosed in Patent Application No. 2-206548 comprises forming a substrate having a non-porous semiconductor monocrystalline layer and a porous semiconductor layer, bonding another substrate having an insulating material surface to the surface of the monocrystalline layer, and removing the porous semiconductor layer by etching.

This invention is to further improve a structure shown in Patent Application No. 2-206548 as previously proposed.

The invention as disclosed in Patent Application No. 2-206548 provides a method very excellent in productivity, uniformity and controllability for forming a semiconductor layer having excellent crystallinity equal to that of a monocrystalline wafer on insulating substrates.

However, in the above-mentioned method of forming the SOI structure by bonding, when a high temperature treatment for the bonding was conducted to bond substrates having different thermal expansion coefficients, the exfoliation might occur on a contact surface because of different degrees of expansion of both substrates on the contact surface.

Even if bonded and joined once, both substrate might be cracked due to less flexibility as both substrates were bonded using a thick bulk.

Particularly, it is difficult to bond different kinds of substrates.

However, with either of the above methods, it was not easy to provide an SOI layer stably having the crystallinity equal to that of an Si wafer on insulating substances such as a light-transparent glass substrate which is one of the insulating substrates.

SUMMARY OF THE INVENTION

An object of the present invention is to provide a method of producing a semiconductor member which realizes an SOI structure having no exfoliations and cracks with the above-mentioned bonding method.

Another object of the present invention is to provide a method of producing a semiconductor member superior in productivity, uniformity, controllability, yield and cost, in obtaining an Si crystalline layer having the crystallinity equal to that of a monocrystalline wafer on insulating substances, represented by a transparent glass substrate (light-transparent substrate).

A further object of the present invention is to provide a method of preparing a semiconductor member which is capable of realizing the advantages of conventional SOI devices and can be applied to various fields.

Another object of the present invention is to provide a method of preparing a semiconductor member which can be used in place of the expensive SOS or SIMOX used for producing a large scale integrated circuit having the SOI structure.

DETAILED DESCRIPTION OF THE PREFERRED EMBODIMENTS

Figure 1A:
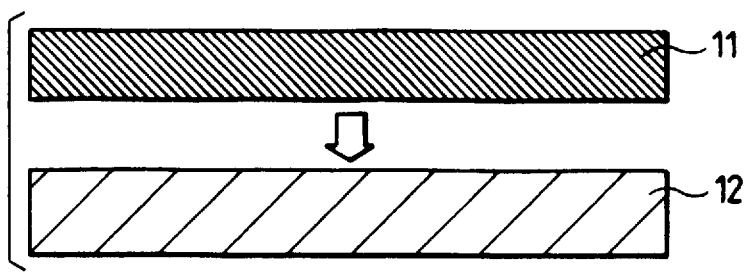
FIGS. 1(*a*) to 1(*e*) are schematic views for explaining an example of the method of producing a semiconductor member of the present invention.

A first embodiment of the method of preparing a semiconductor member of this invention will now be described.

That is, it is characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove porous Si by chemical etching after the primary bonding process, and secondary bonding process of strengthening the primary bonding after the etching process.

A second embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove porous Si by chemical etching immersing the substrate in hydrofluoric acid after the primary bonding process, and secondary bonding process of strengthening the primary bonding after the etching process.

A third embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove porous Si by chemical etching immersing the substrate in a mixture containing hydrofluoric acid and alcohol after the primary bonding process, and secondary bonding process of strengthening the primary bonding after the etching process.

A fourth embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove porous Si by chemical etching immersing the substrate in a mixture containing hydrofluoric acid and hydrogen peroxide after the primary bonding process, and secondary bonding process of strengthening the primary bonding after the etching process.

A fifth embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove porous Si by chemical etching immersing the substrate in a mixture containing hydrofluoric acid, alcohol and hydrogen peroxide after the primary bonding process, and secondary bonding process of strengthening the primary bonding after the etching process.

A sixth embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove porous Si by chemical etching immersing the substrate in a mixture containing buffered hydrofluoric acid (a mixed aqueous solution of hydrofluoric acid and ammonium fluoride) after the primary bonding process, and secondary bonding process of strengthening the primary bonding after the etching process.

A seventh embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove the porous Si by chemical etching immersing the substrate in a mixture containing buffered hydrofluoric acid (a mixed aqueous solution of hydrofluoric acid and ammonium fluoride) and alcohol after the primary bonding process, and secondary bonding process of strengthening the primary bonding after the etching process.

An eighth embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching the porous Si to remove porous Si by chemical etching immersing the substrate in a mixture containing buffered hydrofluoric acid (a mixed aqueous solution of hydrofluoric acid and ammonium fluoride) and hydrogen peroxide after the primary bonding process, and secondary bonding process of strengthening the primary bonding after the etching process.

A ninth embodiment of the present invention is a method of preparing a semiconductor member characterized by comprising, process of making a porous Si substrate and then forming a non-porous Si monocrystalline layer on the porous Si substrate, primary bonding process of bonding the porous Si substrate and an insulating substrate via the non-porous Si monocrystalline layer, etching process of etching porous Si to remove porous Si by chemical etching immersing the substrate in a mixture containing buffered hydrofluoric acid (a mixed aqueous solution of hydrofluoric acid and ammonium fluoride), alcohol and hydrogen peroxide after the primary bonding process, and secondary bonding process of strengthening the primary bonding after the etching process.

According to the present invention, the secondary bonding process of bonding the Si/SiO$_2$ layer and an insulating substrate such as a light-transparent substrate more strongly is performed after the porous Si substrate is etched to make a thin film, so that the substrate and the thin film are bonded. Therefore, it is possible to prevent exfoliations or cracks caused by the difference between thermal expansion coefficients of the substrate and the thin film in the bonding process even if they are subjected to the heat treatment at high temperature to provide a stronger bondage thereof, because the thin film is bonded in alignment with the substrate owing to the good flexible property of the thin film. And it is thus possible to form the thin film Si layer having an excellent monocrystalline structure uniformly on the insulating substrate, represented by the light-transparent substrate.

For the method of fabricating a semiconductor substrate according to the present invention, when it is made porous with only one surface layer of the Si substrate left behind, it is possible to obtain Si monocrystal with significantly less defects on the insulating substrate at low cost in such a manner as to leave Si active layer on the surface, using the epitaxial Si monocrystal having a uniformly flat and quite excellent crystallinity over a large area and remove the active layer from its one surface.

According to the present invention, to obtain Si crystalline layer having the excellent crystallinity equal to that of monocrystalline wafer on the insulating substrate, it is possible to bond Si monocrystalline layer onto the light-transparent substrate having a thermal expansion coefficient different from that of Si more strongly, without causing exfoliations or cracks, thus providing a method superior in productivity, uniformity, controllability, and economy.

Further, according to the present invention, it is possible to provide a method of fabricating a semiconductor substrate by realizing the advantages of conventional SOI devices to be applied.

Also, according to the present invention, it is possible to provide a method of fabricating a semiconductor substrate which can be used in place of the expensive SOS or SIMOX for producing a large-scale integrated circuit having the SOI structure.

The present invention is to use an originally excellent monocrystalline Si substrate as a starting material, chemically removing a lower portion of the Si substrate, with a monocrystalline layer left only on the surface thereof, for the transfer onto the light-transparent substrate, thereby establishing a method of bonding materials having different thermal coefficients and enabling many treatments to be performed in a short time.

In particular, the invention as described in the second to ninth embodiments is to provide a method of fabricating a semiconductor member by using a wet chemical etching solution which has no bad effect on the semiconductor process in etching of porous Si, thereby exhibiting an etching selection ratio of a five digits value or more of porous Si to non-porous Si in this etching solution and excellent controllability and productivity.

The present invention will be described below in detail.
(Embodiment 1-1)

FIGS. 1(a) to (e) are process views for explaining one example of the method of preparing a semiconductor substrate of the present invention, each shown as a schematic cross-sectional view in each process.

According to the result of an observation by a transmission electron microscope, micro-pores of an average diameter of about 600 Å are formed in the porous Si layer, so that the density of the layer has been reduced half or below that of the monocrystalline Si. Nevertheless, the monocrystallinity is still maintained, so that it is possible to form a monocrystalline Si layer on the porous layer by epitaxial growth. When the temperature exceeds 1000° C., rearrangement of internal pores occurs, which impedes the acceleration of the etching. For this reason, the epitaxial growth of the Si layer is preferably effected by a low-temperature growth method such as, for example, a molecular beam epitaxial growth method, a CVD method such as plasma CVD method, low-pressure CVD or photo CVD method, a bias sputter method, or a liquid-phase growth method.

A description will now be given of the method in which after making a P-type or high-density N-type (highly dense enough to realize the porous structure) Si substrate entirely porous, the epitaxial growth of a monocrystalline layer is made.

First, a P-type Si monocrystalline substrate 11 is prepared and made entirely porous, as shown in FIG. 1(a).

Figure 1B:
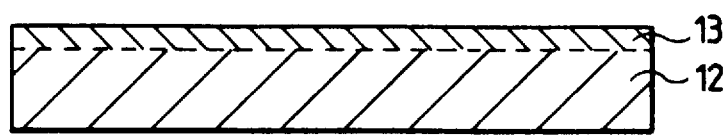

Next, the epitaxial growth is made on the surface of a porous substrate 12, with one of various growth methods, as shown in FIG. 1(b), to form a thin film monocrystalline layer 13. The P-type Si substrate is made porous by anodization using an HF solution. The density of the porous Si layer can be changed to the range of 1.1 to 0.6 g/cm$^3$ by changing the concentration of the HF solution from 50 to 20%, as compared with the density of 2.33 g/cm$^3$ of monocrystalline Si.

This porous layer is not formed on the N-type Si layer, owing to the following reasons, but only on the P-type Si substrate. The porous Si layer has pores having an average size of about 600 Å which was measured by observation with a transmission electron microscope.

Porous Si was discovered in the course of research on electrolytic polishing of a semiconductor which was conducted by Uhlir et al., in 1956 (A. Uhlir, Bell Syst. Tech. J., vol. 35, 333 (1956)).

Unagami et al. investigated dissolving reaction of Si during anodization and reported that the anodic reaction of Si in an HF solution requires positive holes, and that the reaction is expressed as follows (T. Unagami, J. Electrochem. soc., vol. 127, 476 (1980)).

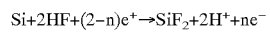
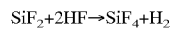
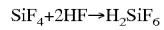

or

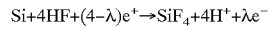
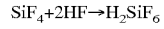

where e$^+$ and e$^-$ respectively denote a positive hole and an electron, and n and λ each denote the number of positive holes required for dissolving one silicon atom. Porous Si can be formed when the condition, n>2 or λ>4, is satisfied.

As described above, the P-type Si having positive holes can be made porous, while the N-type Si cannot be made porous. The selectivity in producing a porous structure has been demonstrated by Nagano et al. and Imai (Nagano, Nakajima, Yasumo, Oonaka, Kajiwara, Electronic Communications Institute Technical Studies Report, vol. 79, SSD79-9549 (1979)), (K. Imai, Solid-State Electronics, vol. 24, 159 (1981)).

However, it is also reported that high-density N-type Si can be made porous (R. P. Holmstrom and J. K. Chi, Appl.

Phys. Lett., vol. 42, 386 (1983)), so that it is important to select a substrate which can be made porous irrespectively of whether it is P-type or N-type.

Porous layer is internally formed with a large amount of gaps, resulting in the density decreasing to half or less. Consequently, the surface area will drastically increase as compared with that of deposition, so that its chemical etching rate is remarkably higher than that of the normal monocrystalline layer.

Figure 1C:
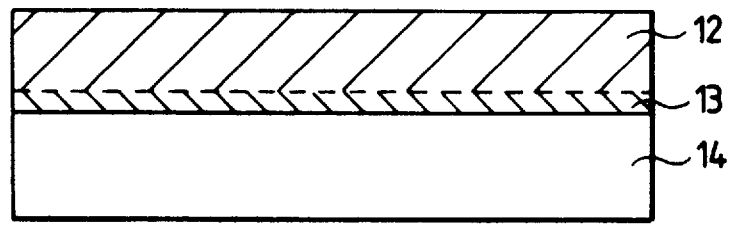

Referring now to FIG. 1(c), a light-transparent substrate 14, which is typically a glass sheet, is prepared as an insulating substrate, and bonded on the surface of monocrystalline Si layer 13, to a degree of pulling against each other with a Van der Waals force (primary bonding). It will be appreciated that after an oxide layer is formed on the surface of Si monocrystalline layer 13, the oxide layer and the light-transparent substrate 14 may be bonded. Also, it will be appreciated that in place of the light-transparent substrate 14, a substrate having an oxide layer formed on the surface of monocrystalline Si may be used. The bonding strength of the primary bonding must be strong enough to retain the primary bonding state, without causing exfoliations in the course to the secondary bonding to be performed later. The primary bonding can be performed at room temperature, or by heating, but when heating, the heating temperature must be lower than the temperature used for the secondary bonding. The temperature for the secondary bonding is suitably in a range of 200° to 800° C., depending on the material of insulating substrate.

Figure 1D:
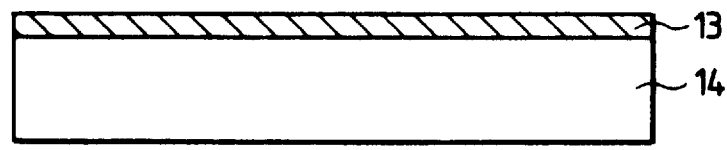

Thereafter, the porous Si substrate 12 is entirely etched, whereby a thinned monocrystalline Si layer 13 is left on the light transparent substrate 14, as shown in FIG. 1(d). If the etching solution may also etch the light-transparent glass substrate 14 in etching, an anti-etching film must be provided on the back surface of the light-transparent glass substrate 14, except for an instance where the light-transparent glass substrate 14 is etched more or less, but the etched surface is not different from an optically polished surface, and an instance where the light-transparent glass substrate 14 is not etched at all. An $Si_3N_4$ layer is formed by deposition as the anti-etching film to entirely cover the two adjacently placed substrates, and the $Si_3N_4$ layer on the porous Si substrate is removed. It is possible to use other materials such as Apiezon wax, in place of $Si_3N_4$, as the material of the anti-etching layer.

Finally, with the heat treatment, $Si/SiO_2$ layer and light-transparent substrate 14 are bonded more strongly for the secondary bonding. Since the thin film and the light-transparent substrate are bonded as above described, the thin film is bonded in alignment with the substrate, so that it is possible to prevent exfoliations and cracks of the substrate caused by the difference between their thermal expansion coefficients.

Figure 1E:
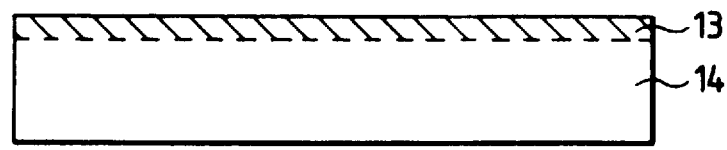

FIG. 1(e) shows the semiconductor substrate obtained by this embodiment, in which a monocrystalline Si layer 13 having a crystallinity equivalent to that of a silicon wafer is formed on the light-transparent substrate 14, with high degrees of smoothness and uniformity, and with a small thickness, over a wide area covering the whole surface of the wafer.

The semiconductor substrate thus obtained is advantageous from the view point of production of an insulation-isolated electronic device.

(Embodiment 1-2)

Another embodiment for the method of fabricating a semiconductor substrate according to the prevent invention will be described in detail with reference to the drawings.

FIGS. 2(a) to (e) are process views for explaining another example of the method of preparing a semiconductor substrate of the present invention, each shown as a schematic cross-sectional view in each process.

Figure 2A:
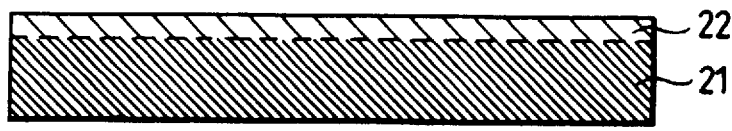
FIGS. 2(*a*) to 2(*e*) are schematic views for explaining an example of the method of producing a semiconductor member of the present invention.

First, a low-carrier density layer 22 is formed by epitaxial growth with one of various thin film growth methods or by counter doping the surface of a high-carrier density Si substrate 21, as shown in FIG. 2(a). Alternatively, an N-type monocrystalline layer 22 may be formed on the surface of a P-type Si monocrystalline substrate 21 by ion implantation of protons.

Figure 2B:
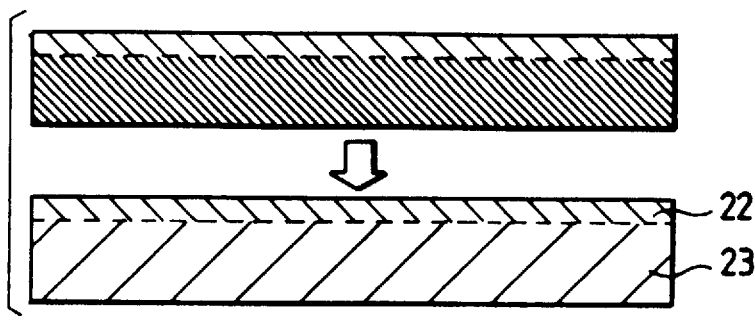

Then, as shown in FIG. 2(b), the P-type or high-density N-type Si monocrystalline substrate 21 is changed into a porous Si substrate 23 by effecting, on the reverse side thereof, anodization using an HF solution. The initial monocrystalline Si having the density of 2.33 g/cm³ can be changed into a porous member the density of which can be varied within the range between 1.1 and 0.6 g/cm³ by varying the HF concentration of the etching solution between 50% and 20%. This porous member is formed into a P-type or high-density N-type Si substrate, as above described.

Figure 2C:
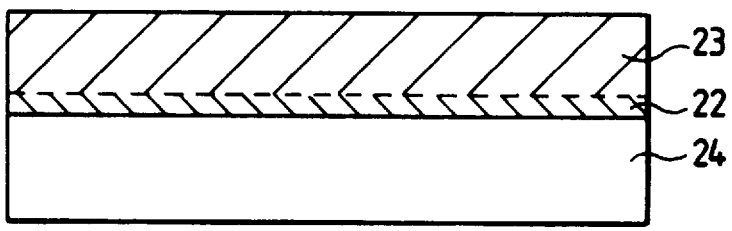

Referring now to FIG. 2(c), a light-transparent substrate 24, which is typically a glass sheet, is prepared as an insulating substrate, and bonded on the surface of Si monocrystalline layer 22, to a degree of pulling against each other with a Van der Waals force (primary bonding). It will be appreciated that after an oxide layer is formed on the surface of Si monocrystalline layer 22, the oxide layer and the light-transparent substrate 24 may be bonded. Also, it will be appreciated that in place of the light-transparent substrate 24, a substrate having an oxide layer formed on the surface of monocrystalline Si may be used.

The bonding strength of the primary bonding must be strong enough to retain the primary bonding state, without causing exfoliations in the course to the secondary bonding to be performed later.

Figure 2D:
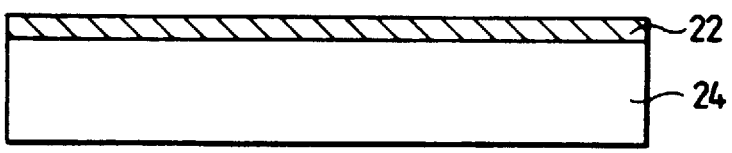

Thereafter, the porous Si substrate 23 is entirely etched, whereby a thinned monocrystalline Si layer 22 is left on the light-transparent substrate 24, as shown in FIG. 2(d). If the etching solution may also etch the light-transparent glass substrate 24 in etching, an anti-etching film must be provided on the back surface of the light-transparent glass substrate 24, except for an instance where the light-transparent glass substrate 24 is etched more or less, but the etched surface is not different from an original optically polished surface, and an instance where the light-transparent glass substrate 24 is not etched at all. An $Si_3N_4$ layer is formed by deposition as the anti-etching film to cover the entire member composed of the two substrates bonded together, and the $Si_3N_4$ layer on the surface of porous Si substrate is removed. It is possible to use other materials such as Apiezon wax, in place of $Si_3N_4$, as the material of the anti-etching layer.

Figure 2E:
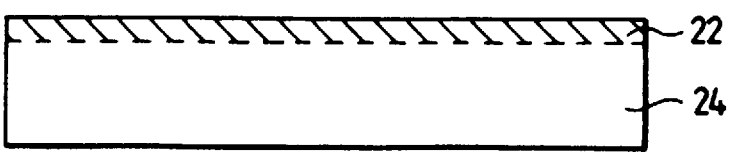

Finally, with the heat treatment, $Si/SiO_2$ layer and light-transparent substrate 14 are bonded more strongly for the secondary bonding, as shown in FIG. 2(e). Since the thin film and the light-transparent substrate are bonded as above described, the thin film is bonded in alignment with the substrate, so that it is possible to prevent exfoliations and cracks of the substrate caused by the difference between their thermal expansion coefficients.

FIG. 2(e) shows the semiconductor substrate obtained by this embodiment, in which a monocrystalline Si layer 22 having a crystallinity equivalent to that of a silicon wafer is formed on the light-transparent substrate 24, with high degrees of smoothness and uniformity, and with a small thickness, over a wide area covering the whole surface of the wafer. The semiconductor substrate thus obtained is advantageous from the view point of production of an insulation-isolated electronic device.

The above method is one in which an apitaxial layer is formed before making a porous structure, and then the regions other than the epitaxial layer are made porous selectively by anodization.

(Embodiment 2-1)

FIGS. 3(a) to (d) are process views for explaining this embodiment, each shown as a schematic cross-sectional view in each process.

The following will be given of a method in which the whole P- or high-density N-type Si substrate is changed into porous structure, and then a non-porous monocrystal Si layer is formed on the porous structure by epitaxial growth.

Figure 3A:
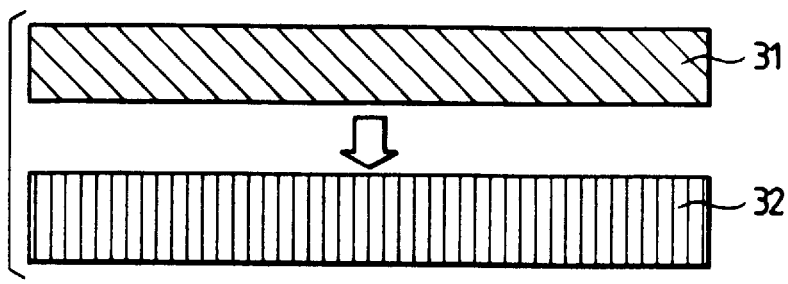
FIGS. 3(*a*) to 3(*e*) are schematic views for explaining an example of the method of producing a semiconductor member of the present invention.

Referring to FIG. 3(a), as the first step, an Si monocrystalline semiconductor member 31 of P-type is prepared, and is wholly changed into porous structure 32.

Figure 3B:
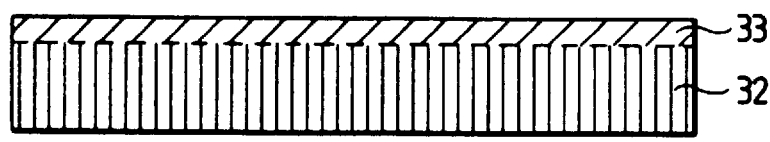

Then, as shown in FIG. 3(b), an epitaxial growth is effected by a suitable method on the surface of the porous member 32, thereby forming a monocrystalline Si layer 33.

Figure 3C:
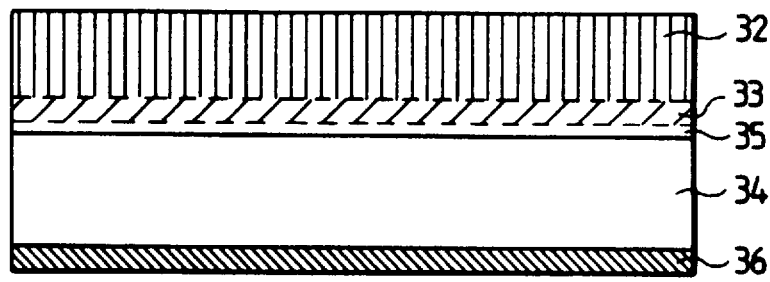

Then, as shown in FIG. 3(c), the surface of the monocrystalline Si layer 33 on the porous Si substrate 32 is oxidized to form an oxide film 35. This oxide film 35 is formed to reduce the interface level of the monocrystalline layer 33 which is a final active layer.

Then, an insulating substrate 34 such as a light-transparent glass substrate is bonded on the surface of the oxide film 35, to a degree of pulling against each other with a Van der Waals force, or to a degree that bonded interfaces may not exfoliate due to a difference between thermal expansion coefficients of both members (primary bonding). It will be appreciated that this insulating substrate 34 may be, in place of the glass substrate, a substrate having an oxide layer formed on the surface of monocrystalline Si. The bonding strength of the primary bonding must be strong enough to retain the primary bonding state, without yielding exfoliations in the course to the secondary bonding for the complete bonding to be performed later.

Thereafter, an anti-etching film 36 is provided on the back surface of the light-transparent glass substrate 34. An $Si_3N_4$ layer is formed by deposition as the anti-etching film 36 to cover the entire member composed of the two substrates bonded together, and the $Si_3N_4$ layer on the surface of porous Si substrate is removed. It is possible to use other materials such as Apiezon wax, in place of $Si_3N_4$, as the material of the anti-etching layer.

Figure 3D:
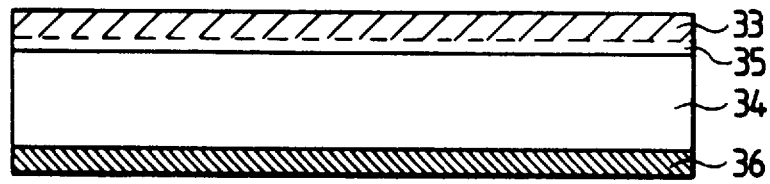
Figure 3E:
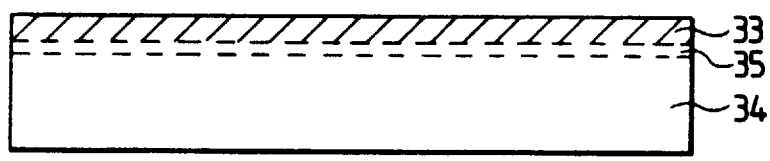

Then, as shown in FIG. 3(d), the porous Si substrate 32 is entirely immersed in hydrofluoric acid with agitation so that only the porous Si is removed by electroless wet chemical etching, whereby a thinned monocrystalline silicon layer 13 is left on the light-transparent substrate 34.

Finally, with the heat treatment, $Si/SiO_2$ layer and light-transparent substrate 14 are bonded more strongly for the secondary bonding which is a complete bonding, as shown in FIG. 1(e), so that a semiconductor member of this embodiment can be obtained by removing the anti-etching film 36.

A description will now be given of the selective etching method of porous Si with hydrofluoric acid used in this embodiment.

Figure 5:
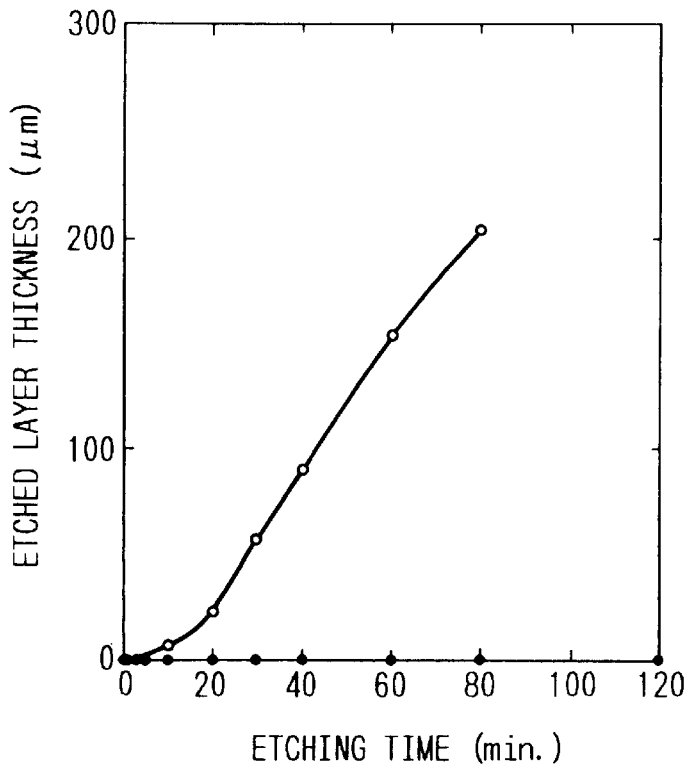
FIG. 5 is a graphic representation showing the etching characteristics of an etching solution applicable to the present invention.

FIG. 5 shows the etching time dependency of etched thickness of porous Si and monocrystalline Si when the porous Si and the monocrystalline Si are etched by being immersed in 49% hydrofluoric acid and agitated.

The porous Si was formed by anodizing a monocrystalline Si. The conditions of anodization are shown below. It is to be noted, however, that the starting material for producing porous Si by anodization is not limited to monocrystalline Si and Si of other crystalline structure may be used as the starting material.

| Voltage applied: | 2.6 (V) |
| Current density: | 30 (mA · cm$^{-2}$) |
| Anodizing solution: | $HF:H_2O:C_2H_5OH = 1:1:1$ |
| Time: | 2.4 hours |
| Thickness of porous Si: | 300 ($\mu$m) |
| Porosity: | 56 (%) |

Test pieces of the porous Si thus prepared were immersed in 49% hydrofluoric acid solution (white circles) at the room temperature and agitated. The reduction in the thickness of the porous Si was then measured. The porous Si was rapidly etched: namely, a layer thickness of 90 $\mu$m in 40 minutes, and further 205 $\mu$m in 80 minutes, with high degrees of surface quality and uniformity.

The etching rate has dependencies on the concentration of the etching solution and the temperature.

Test pieces of non-porous Si having a thickness of 500 $\mu$m were immersed in 49% hydrofluoric acid solution (black circles) at the room temperature and agitated. The reduction in the thickness of the non-porous Si was then measured. The non-porous Si was only etched to 50 Å or less after elapse of 120 minutes.

The etched test pieces of porous Si and non-porous Si were then rinsed with water and the surfaces after the rinsing were examined by microanalysis using secondary ions but no impurity was detected.

The conditions for the solution concentration and the temperature were set in the range where the etching rate of porous Si and the selection ratio of etching the porous Si and the non-porous Si have no effect in the practical use such as a fabrication process.

A description will be made of the etching solution in which the porous Si is etched.

Known methods of etching porous Si are the following two methods.

1. The method of etching porous Si with an aqueous NaOH solution (G. Bonchil, R. Herino, K. Barla, and J. C. Pfister, J. Electrochem. Soc., Vol. 130, No. 7, 1611 (1983)).

2. The method of etching porous Si with an etching solution which is capable of etching monocrystalline Si.

In the above method 2, a fluoronitric acid-type etching solution is generally used, and etching of Si proceeds as follows:

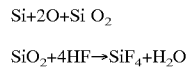

$$SiO_2 + 4HF \rightarrow SiF_4 + H_2O$$

That is, Si is oxidized by nitric acid to $SiO_2$, and the $SiO_2$ produced is etched with hydrofluoric acid.

Examples of etching solutions for non-porous Si include the above fluoronitric acid-type etching solution as well as ethylenediamine-type, KOH-type and hydrazine-type etching solutions and the like.

It will be thus understood that it is desirable in selective etching of porous Si to select an etching solution which is capable of etching porous Si, other than the above etching solutions used for the etching of crystalline Si. The porous Si is conventionally selectively etched by the method which uses an aqueous NaOH solution as an etching solution.

As above described, the porous Si is etched with the fluoronitric acid-type etching solution, but monocrystalline Si may be possibly etched.

In the conventional method of selectively etching porous Si with an aqueous NaOH solution, Na ions are inevitably adsorbed on the etched surface. Since the Na ions cause impurity contamination, are movable and have adverse effects such as the formation of interfacial state, it is desirable that the ions are not introduced into the semiconductor process.

In this embodiment, the etching solution is hydrofluoric acid, which has no etching action on the non-porous Si, but is used in an ordinary semiconductor process, with quite less etching contamination.

Thus, in this embodiment, it is possible to selectively etch the porous Si, but not the non-porous Si, by the chemical etching with high degrees of efficiency and uniformity, without having adverse effects on the process.

(Embodiment 2-2)

FIGS. 4(a) to (e) are process views for explaining this embodiment, each shown as a schematic cross-sectional view in each process.

Figure 4A:
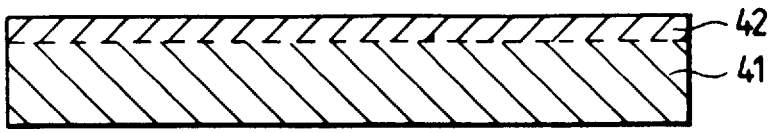
FIGS. 4(*a*) to 4(*e*) are schematic views for explaining an example of the method of producing a semiconductor member of the present invention.

First, a low-carrier density layer 42 is formed by epitaxial growth with one of various thin film growth methods or by counter doping the surface of a high-carrier density Si substrate 41, as shown in FIG. 4(a). Alternatively, an N-type monocrystalline layer 42 may be formed on the surface of a P-type Si monocrystalline substrate 41 by ion implantation of protons.

Figure 4B:
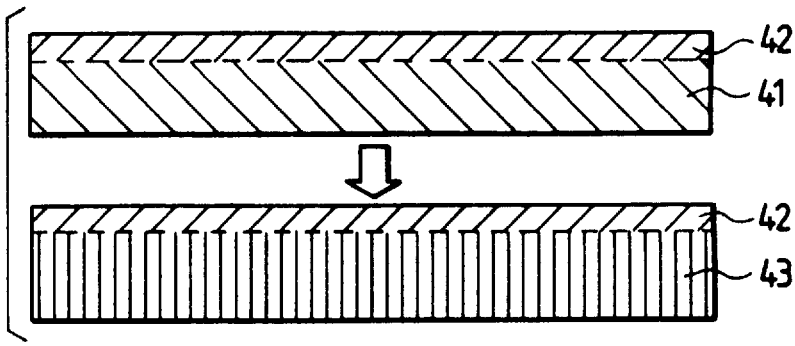

Then, as shown in FIG. 4(b), the P-type or high-density N-type Si monocrystalline substrate 41 is changed into a porous Si substrate 43 by effecting, on the reverse side thereof, anodization using an HF solution. The initial monocrystalline Si having the density of 2.33 g/cm$^3$ can be changed into a porous member the density of which can be varied within the range between 1.1 and 0.6 g/cm$^3$ by varying the HF concentration of the etching solution between 50% and 20%. This porous member is formed into a P-type or high-density N-type Si substrate, as above described.

Figure 4C:
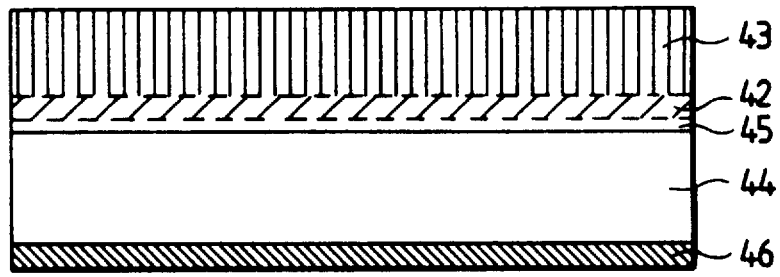

Referring now to FIG. 4(c), a light-transparent substrate 44, which is typically a glass sheet, is prepared as an insulating substrate, and after oxidizing the surface of monocrystalline Si layer on a porous Si substrate, bonded on the oxidized surface at the room temperature or by heating, to a degree of pulling against each other with a Van der Waals force or to a degree that the bonded interfaces may not exfoliate due to a difference between thermal expansion coefficients of both members (primary bonding). It will be appreciated that in place of the light-transparent substrate 34, a substrate having an oxide layer formed on the surface of monocrystalline Si may be used. The bonding strength of the primary bonding must be strong enough to retain the primary bonding state, without yielding exfoliations in the course to the secondary bonding for the complete bonding to be performed later. The oxide layer 45 on the surface of monocrystalline layer is formed to reduce the interface level of the monocrystalline layer 42 which is a final active layer.

Thereafter, an anti-etching film 46 is provided on the back surface of the light-transparent glass substrate 44. An $Si_3N_4$ layer is formed by deposition as the anti-etching film to cover the entire member composed of the two substrates bonded together, and the $Si_3N_4$ layer on the surface of porous Si substrate is removed. It is possible to use other materials such as Apiezon wax, in place of $Si_3N_4$, as the material of the anti-etching layer.

Figure 4D:
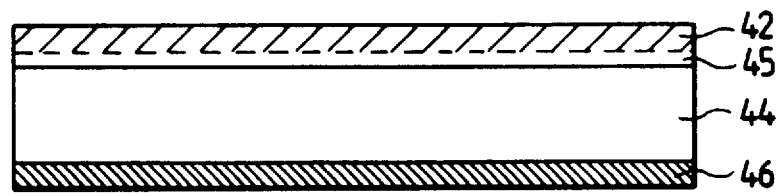

Then, as shown in FIG. 4(d), the porous Si substrate 43 is entirely immersed in hydrofluoric acid, with agitating so that only the porous Si is etched by electroless wet chemical etching, whereby a thinned monocrystalline Si layer 42 is left on the light-transparent substrate 44.

Finally, with the heat treatment, $Si/SiO_2$ layer and light-transparent substrate 44 are bonded completely in the secondary bonding.

Since the thin film and the light-transparent substrate are bonded as above described, the thin film is bonded in alignment with the substrate, so that it is possible to prevent exfoliations and cracks of the substrate caused by the difference between their thermal expansion coefficients.

Figure 4E:
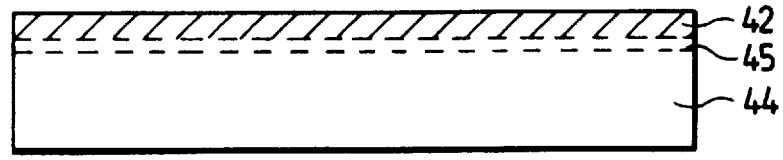

FIG. 4(e) shows the semiconductor substrate obtained by this embodiment, in which a monocrystalline Si layer 42 having a crystallinity equivalent to that of a silicon wafer is formed on the light-transparent substrate 44, with high degrees of smoothness and uniformity, and with a small thickness, over a wide area covering the whole surface of the wafer. The semiconductor substrate thus obtained is advantageous from the view point of production of an insulation-isolated electronic device.

The conditions for the solution concentration and the temperature were set in the range where the etching rate of porous Si and the selection ratio of etching the porous Si and the non-porous Si have no effect in the practical use such as a fabrication process.

The above method is one in which an epitaxial layer is formed before making a porous structure, and then the regions other than the epitaxial layer are made porous selectively by anodization.

The above embodiments 2-1 and 2-2 are provided with the oxide layers 35, 45 and the anti-etching films 36, 46, but can be realized without them, with the same effects of the present invention.

The etching rate has dependencies on the concentration of the etching solution and the temperature. The etching solution concentration and temperature are suitably determined in practical ranges. In the embodiments 2-1 and 2-2, 49% hydrofluoric acid and the room temperature are used, but the present invention is not limited to such conditions. Preferably, the concentration of the hydrofluoric acid is 5% to 95%, and the temperature is set to a level which is ordinarily adopted.

(Embodiment 3-1)

The etching can be made using a mixture liquid of hydrofluoric acid and alcohol, in place of hydrofluoric acid used for an etching solution in embodiments 2-1 and 2-2. In this case, porous Si can be selectively etched with high degrees of efficiency and uniformity, without etching non-porous Si, as in the embodiments 2-1 and 2-2.

Figure 6:
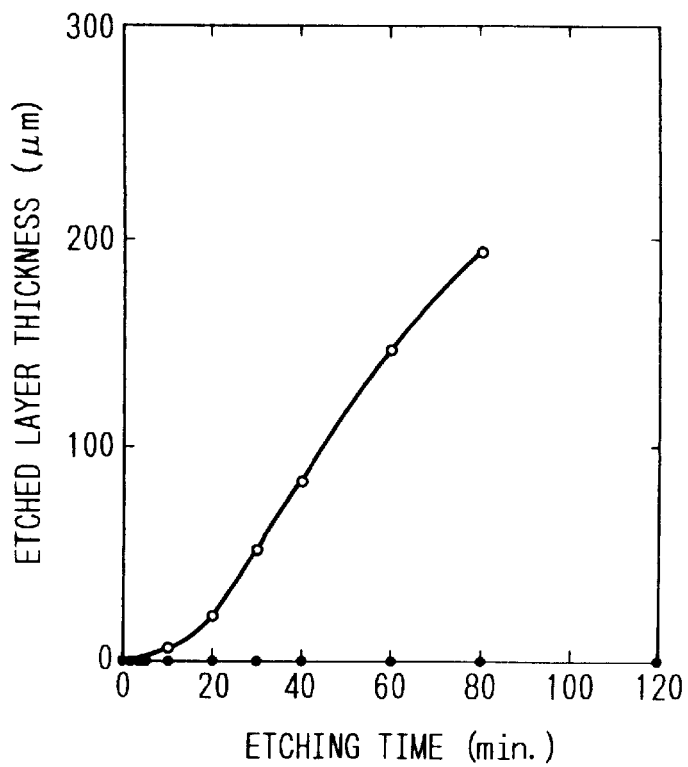
FIG. 6 is a graphic representation showing the etching characteristics of an etching solution applicable to the present invention.

FIG. 6 shows the time dependency of etching thickness of porous Si and monocrystalline Si as observed when the porous Si and the monocrystalline Si are etched by being immersed in the mixture liquid (10:1) of 49% hydrofluoric acid and alcohol without agitation of the liquid.

The porous Si was formed by anodizing the monocrystalline Si. The conditions of anodization are shown below. It is to be noted, however, that the starting material for producing porous Si by anodization is not limited to monocrystalline Si and Si of other crystalline structure may be used as the starting material.

| | |
|---|---|
| Voltage applied: | 2.6 (V) |
| Current density: | 30 (mA · cm$^{-2}$) |
| Anodizing solution: | $HF:H_2O:C_2H_5OH$ = 1:1:1 |
| Time: | 2.4 hours |
| Thickness of porous Si: | 300 ($\mu$m) |
| Porosity: | 56 (%) |

Test pieces of the porous Si prepared as described above were immersed, without agitation, in a mixture solution (10:1) of 49% hydrofluoric acid and alcohol (white circles). The reduction in the thickness of the porous Si was then measured. The porous Si was rapidly etched: namely, by a layer thickness of 85 μm in 40 minutes, and further 195 μm in 80 minutes, with high degrees of surface quality and uniformity. The etching rate depends on the concentration of the etching solution and the temperature.

Test pieces of non-porous Si having a thickness of 500 μm were immersed in a mixture liquid (10:1) of 49% hydrofluoric acid and alcohol (black circles) at the room temperature without agitation. The reduction in the thickness of the non-porous Si was then measured. The non-porous Si was only etched to 50 Å or less after elapse of 120 minutes.

In particular, the addition of alcohol serves to remove bubbles of reaction product gases generated as a result of the etching without delay from the surface being etched, without necessitating agitation, thus ensuring a high efficiency and uniformity of the etching.

The etched test pieces of porous Si and non-porous Si were then rinsed with water and the surfaces after the rinsing were examined by microanalysis using secondary ions but no impurity was detected.

The conditions for the concentration of etching solution and the temperature were set in the range where the etching rate has no effect in the practical use such as a fabrication process, and alcohol can exhibit its effects. Although the mixture solution (10:1) of 49% hydrofluoric acid and ethyl alcohol, as well as the room temperature as the solution temperature, are mentioned, the present invention is not limited to such conditions.

The HF concentration with respect to the etching solution preferably ranges between 1 and 95%, more preferably between 5 and 90%, and most preferably between 5 and 80%. The alcohol concentration with respect to the etching solution is preferably 80% or less, more preferably 60% or less, and most preferably 40% or less, and is determined so as to provide an appreciable effect of alcohol. The temperature is set in a range of preferably 0° to 100° C., more preferably 5° to 80° C., and most preferably 5° to 60° C.

Although ethyl alcohol has been used in this invention, other alcohols such as isopropyl alcohol, which does not cause any inconvenience in the commercial production and which can provide an appreciable effect of addition of such alcohol, may be used as the alcohol.

(Embodiment 3-2)

The etching can be made using a mixture liquid of hydrofluoric acid and hydrogen peroxide, in place of hydrofluoric acid used for an etching solution in embodiments 2-1 and 2-2. In this case, porous Si can be selectively etched with high degrees of efficiency and uniformity, without etching non-porous Si, as in the embodiments 2-1 and 2-2.

The selective etching of porous Si will be described below with a mixture solution of hydrofluoric acid and hydrogen peroxide for use in this embodiment.

Figure 7:
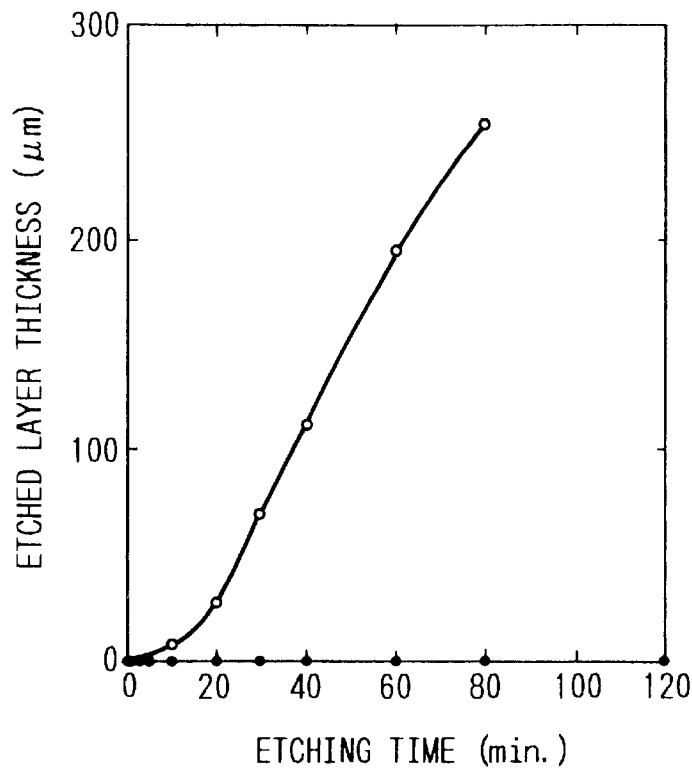
FIG. 7 is a graphic representation showing the etching characteristics of an etching solution applicable to the present invention.

FIG. 7 shows the time dependency of etching thickness of porous Si and monocrystalline Si as observed when the porous Si and the monocrystalline Si are etched by being immersed in a mixture liquid (1:5) of 49% hydrofluoric acid and 30% hydrogen peroxide and agitated.

The porous Si was formed by anodizing the monocrystalline Si. The conditions of anodization are shown below. It is to be noted, however, that the starting material for producing porous Si by anodization is not limited to monocrystalline Si and Si of other crystalline structure may be used as the starting material.

| | |
|---|---|
| Voltage applied: | 2.6 (V) |
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 (μm) |
| Porosity: | 56 (%) |

Test pieces of the porous Si prepared as described above were immersed, without agitation, in the mixture solution (1:5) of 49% hydrofluoric acid and 30% hydrogen peroxide (white circles) at the room temperature. The reduction in the thickness of the porous Si was then measured. The porous Si was rapidly etched: namely, by a layer thickness of 112 μm in 40 minutes, and further 256 μm in 80 minutes, with high degrees of surface quality and uniformity. The etching rate has dependencies on the concentration of the etching solution and the temperature.

Test pieces of non-porous Si having a thickness of 500 μm were immersed in the mixture liquid (1:5) of 49% hydrofluoric acid and 30% hydrogen peroxide (black circles) at the room temperature and agitated. The reduction in the thickness of the non-porous Si was then measured. The non-porous Si was only etched to 50 Å or less after elapse of 120 minutes.

In particular, the addition of hydrogen peroxide serves to accelerate oxidation of silicon, thus enhancing the reaction speed as compared to the case where hydrogen peroxide is not added. Furthermore, the reaction speed can be controlled by suitably selecting the content of the hydrogen peroxide.

The etched test pieces of porous Si and non-porous Si were then rinsed with water and the surfaces after the rinsing were examined by microanalysis using secondary ions but no impurity was detected.

Although the concentration of hydrogen peroxide solution was 30% herein, it can be set to fall within the ranges which would not impair the addition effect of hydrogen peroxide and cause any practical inconvenience in commercial production.

The etching rate depends on the solution concentrations of hydrofluoric acid and hydrogen peroxide, as well as the temperature. The addition of hydrogen peroxide solution makes it possible to accelerate the oxidation of silicon, and the reaction speed as compared to the case when it is not added. Further, the reaction speed can be controlled by suitably selecting the content of the hydrogen peroxide.

The conditions for the concentration of etching solution and the temperature can be set to fall within the ranges in which the effects of hydrofluoric acid and hydrogen peroxide solution can be exhibited and the etching rate would not cause any practical inconvenience in commercial production. Although the mixture solution (1:5) of 49% hydrofluoric acid and hydrogen peroxide, as well as the room temperature as the solution temperature, are mentioned as an instance, the present invention is not limited to such conditions.

The HF concentration with respect to the etching solution preferably ranges between 1 and 95%, more preferably between 5 and 90%, and most preferably between 5 and 80%. The H$_2$O$_2$ concentration with respect to the etching solution preferably ranges between 1 and 95%, more preferably between 5 and 90%, and most preferably between 10 and 80%, and is determined so as to provide an appreciable effect of hydrogen peroxide. The temperature is set in a range of preferably 0° to 100° C., more preferably 5° to 80° C., and most preferably 5° to 60° C.

(Embodiment 3-3)

The etching can be made using a mixture liquid of hydrofluoric acid, alcohol and hydrogen peroxide, in place of hydrofluoric acid used for an etching solution in embodiments 2-1 and 2-2. In this case, porous Si can be selectively etched with high degrees of efficiency and uniformity, without etching non-porous Si, as in the embodiments 2-1 and 2-2.

The selective etching of porous Si will be described below with a mixture solution of hydrofluoric acid, alcohol and hydrogen peroxide for use in this embodiment.

Figure 8:
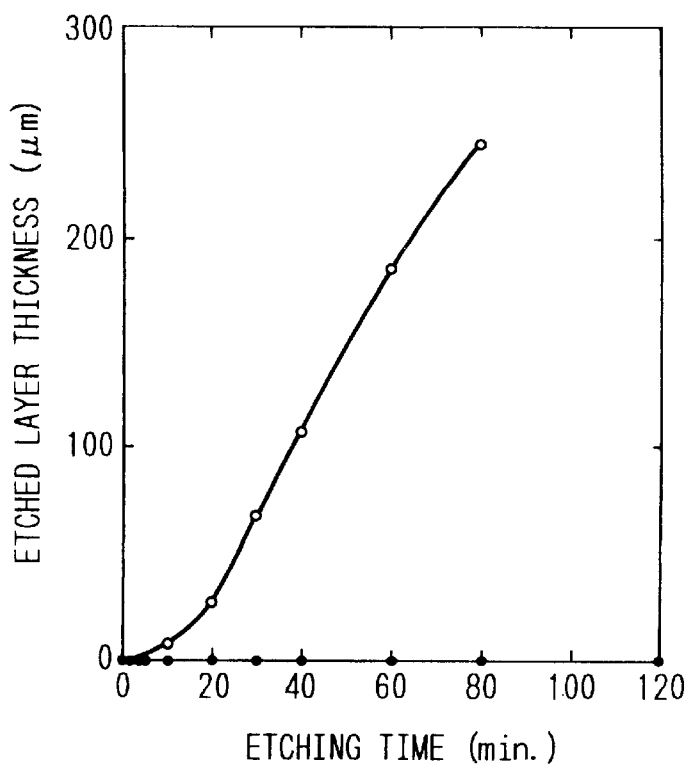
FIG. 8 is a graphic representation showing the etching characteristics of an etching solution applicable to the present invention.

FIG. 8 shows the time dependency of etching thickness of porous Si and monocrystalline Si as observed when the porous Si and the monocrystalline Si are etched by being immersed in a mixture liquid (10:6:50) of 49% hydrofluoric acid, alcohol and 30% hydrogen peroxide without agitation.

The porous Si was formed by anodizing the monocrystalline Si. The conditions of anodization are shown below. It is to be noted, however, that the starting material for producing porous Si by anodization is not limited to monocrystalline Si and Si of other crystalline structure may be used as the starting material.

| | |
|---|---|
| Voltage applied: | 2.6 (V) |
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 ($\mu$m) |
| Porosity: | 56 (%) |

Test pieces of the porous Si prepared as described above were immersed, without agitation, in the mixture solution (10:6:5) of 49% hydrofluoric acid, alcohol and 30% hydrogen peroxide (white circles) at the room temperature. The reduction in the thickness of the porous Si was then measured. The porous Si was rapidly etched: namely, by a layer thickness of 107 $\mu$m in 40 minutes, and further 244 $\mu$m in 80 minutes, with high degrees of surface quality and uniformity. The etching rate depends on the concentration of the etching solution and the temperature.

Test pieces of non-porous Si having a thickness of 500 $\mu$m were immersed in the mixture liquid (10:6:5) of 49% hydrofluoric acid, alcohol and 30% hydrogen peroxide (black circles) at the room temperature without agitation. The reduction in the thickness of the non-porous Si was then measured. The non-porous Si was only etched to 50 Å or less after elapse of 120 minutes.

The etched test pieces of porous Si and non-porous Si were then rinsed with water and the surfaces after the rinsing were examined by microanalysis using secondary ions but no impurity was detected.

Although the concentration of hydrogen peroxide solution was 30% herein, it can be set to fall within the ranges which would not impair the addition effect of hydrogen peroxide and cause any practical inconvenience in commercial production.

The etching rate has dependencies on the solution concentrations of hydrofluoric acid and hydrogen peroxide, as well as the temperature. The addition of hydrogen peroxide solution makes it possible to accelerate the oxidation of silicon, and the reaction speed as compared to the case when it is not added. Further, the reaction speed can be controlled by suitably selecting the content of the hydrogen peroxide. In particular, the addition of alcohol serves to remove bubbles of reaction product gases generated as a result of the etching without delay from the surface being etched, without necessitating agitation, thus ensuring a high efficiency and uniformity of the etching for the porous Si.

The conditions for the concentration of etching solution and the temperature can be set to fall within the ranges in which the effects of hydrofluoric acid, hydrogen peroxide solution and alcohol can be exhibited and the etching rate would not cause any practical inconvenience in commercial production. Although the mixture solution (10:6:5) of 49% hydrofluoric acid, ethyl alcohol and hydrogen peroxide, as well as the room temperature as the solution temperature, are mentioned as an instance, the present invention is not limited to such conditions.

The HF concentration with respect to the etching solution preferably ranges between 1 and 95%, more preferably between 5 and 90%, and most preferably between 5 and 80%. The H$_2$O$_2$ concentration with respect to the etching solution preferably ranges between 1 and 95%, more preferably between 5 and 90%, and most preferably between 10 and 80%, and is determined so as to provide an appreciable effect of hydrogen peroxide. The alcohol concentration with respect to the etching solution is preferably 80% or less, more preferably 60% or less, and most preferably 40% or less, and is determined so as to provide an appreciable effect of alcohol. The temperature is set in a range of preferably 0° to 100° C., more preferably 5° to 80° C., and most preferably 5° to 60° C.

Although ethyl alcohol has been specifically used in this invention, other alcohols such as isopropyl alcohol, which does not cause any inconvenience in the commercial production and which can provide an appreciable effect of addition of such alcohol, may be used as the alcohol.

(Embodiment 3-4)

The etching can be made using a buffered hydrofluoric acid, in place of hydrofluoric acid used for an etching solution in embodiments 2-1 and 2-2. In this case, porous Si can be selectively etched with high degrees of efficiency and uniformity, without etching non-porous Si, as in the embodiments 2-1 and 2-2.

The selective etching of porous Si will be described below with the buffered hydrofluoric acid for use in this embodiment.

Figure 9:
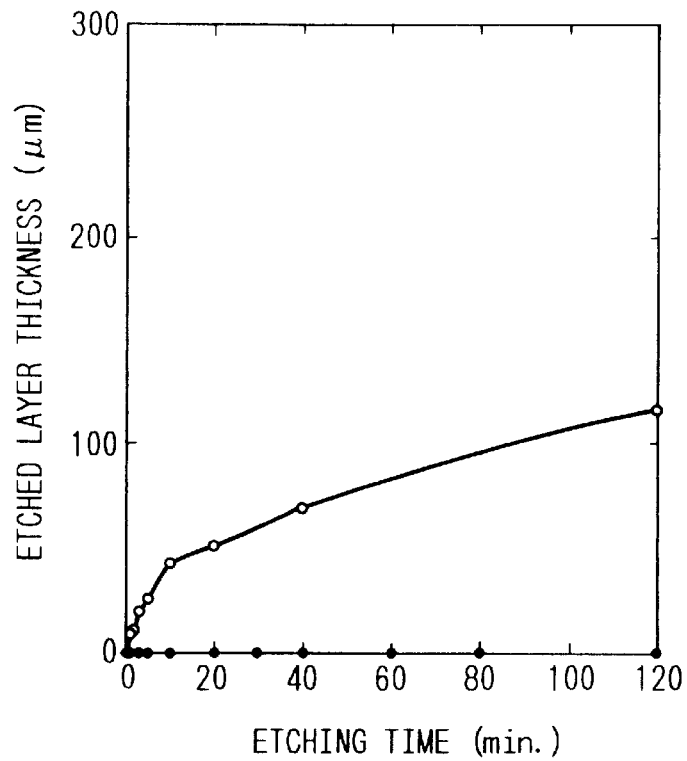
FIG. 9 is a graphic representation showing the etching characteristics of an etching solution applicable to the present invention.

FIG. 9 shows the time dependency of etching thickness of porous Si and monocrystalline Si as observed when the porous Si and the monocrystalline Si are etched by being immersed in buffered hydrofluoric acid (a mixture solution of 4.5% hydrofluoric acid and 36% ammonium fluoride) and agitated.

The porous Si was formed by anodizing the monocrystalline Si. The conditions of anodization are shown below. It is to be noted, however, that the starting material for producing porous Si by anodization is not limited to monocrystalline Si and Si of other crystalline structure may be used as the starting material.

| | |
|---|---|
| Voltage applied: | 2.6 (V) |
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 ($\mu$m) |
| Porosity: | 56 (%) |

Test pieces of the porous Si prepared as described above were immersed, without agitation, in the buffered hydrofluoric acid (a mixture solution of 4.5% hydrofluoric acid and 36% ammonium fluoride) (white circles) at the room temperature. The reduction in the thickness of the porous Si was then measured. The porous Si was rapidly etched: namely, by a layer thickness of 70 $\mu$m in 40 minutes, and further 118 $\mu$m in 120 minutes, with high degrees of surface quality and uniformity. The etching rate has dependencies on the concentration of the etching solution and the temperature.

Test pieces of non-porous Si having a thickness of 500 µm were immersed in the buffered hydrofluoric acid (a mixture solution of 4.5% hydrofluoric acid and 36% ammonium fluoride) (black circles) at the room temperature and agitated. The reduction in the thickness of the non-porous Si was then measured. The non-porous Si was only etched to 50 Å or less after elapse of 120 minutes.

The etched test pieces of porous Si and non-porous Si were then rinsed with water and the surfaces after the rinsing were examined by microanalysis using secondary ions but no impurity was detected.

The buffered hydrofluoric acid is a mixture solution of 36% ammonium fluoride ($NH_4F$) and 4.5% hydrogen fluoride.

The etching rate has dependencies on the solution concentrations, as well as the temperature. The conditions for the concentration of etching solution and the temperature can be set to fall within the ranges in which no practical inconvenience would not be caused in commercial production. Although the buffered hydrofluoric acid containing a solution of 36% ammonium fluoride ($NH_4F$) and 4.5% hydrogen fluoride (HF), as well as the room temperature as the solution temperature, are mentioned as an instance, the present invention is not limited to such conditions.

The HF concentration in the buffered hydrofluoric acid with respect to the etching solution preferably ranges between 1 and 95%, more preferably between 1 and 85%, and most preferably between 1 and 70%. The $NH_4F$ concentration in the buffered hydrofluoric acid with respect to the etching solution preferably ranges between 1 and 95%, more preferably between 5 and 90%, and most preferably between 5 and 80%. The temperature is set in a range of preferably 0° to 100° C., more preferably 5° to 80° C., and most preferably 5° to 60° C.

(Embodiment 3-5)

The etching can be made using a mixture solution of buffered hydrofluoric acid and alcohol, in place of hydrofluoric acid used for an etching solution in embodiments 2-1 and 2-2. In this case, porous Si can be selectively etched with high degrees of efficiency and uniformity, without etching non-porous Si, as in the embodiments 2-1 and 2-2.

The selective etching of porous Si will be described below with the mixture solution of buffered hydrofluoric acid and alcohol for use in this embodiment.

Figure 10:
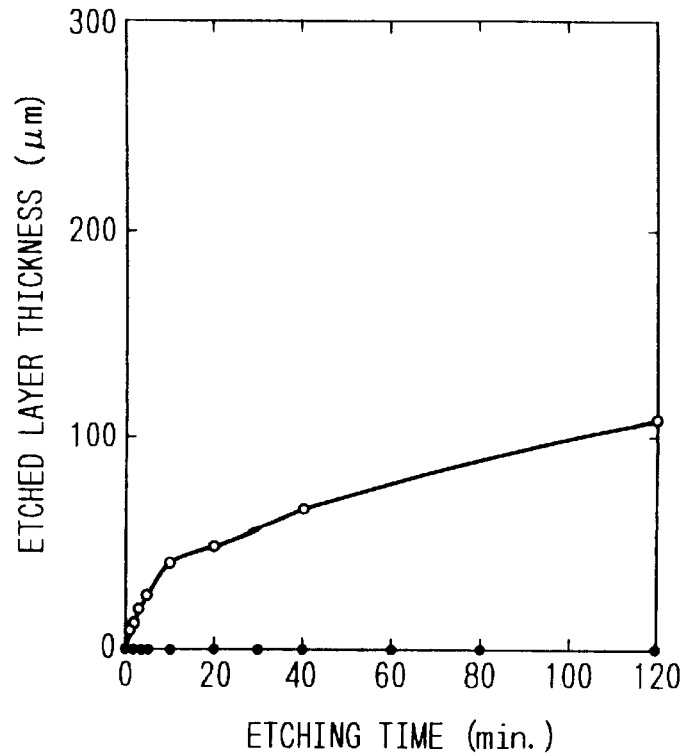
FIG. 10 is a graphic representation showing the etching characteristics of an etching solution applicable to the present invention.

FIG. 10 shows the time dependency of etching thickness of porous Si and monocrystalline Si as observed when the porous Si and the monocrystalline Si are etched by being immersed in the mixture solution (10:1) of buffered hydrofluoric acid (a mixture solution of 4.5% hydrofluoric acid and 36% ammonium fluoride) and alcohol without agitation.

The porous Si was formed by anodizing the monocrystalline Si. The conditions of anodization are shown below. It is to be noted, however, that the starting material for producing porous Si by anodization is not limited to monocrystalline Si and Si of other crystalline structure may be used as the starting material.

| | |
|---|---|
| Voltage applied: | 2.6 (V) |
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 (µm) |
| Porosity: | 56 (%) |

Test pieces of the porous Si prepared as described above were immersed, without agitation, in the mixture solution (10:1) of buffered hydrofluoric acid (a mixture solution of 4.5% hydrofluoric acid and 36% ammonium fluoride) and alcohol (white circles) at the room temperature. The reduction in the thickness of the porous Si was then measured. The porous Si was rapidly etched: namely, by a layer thickness of 83 µm in 40 minutes, and further 140 µm in 120 minutes, with high degrees of surface quality and uniformity. The etching rate depends on the concentration of the etching solution and the temperature.

Test pieces of non-porous Si having a thickness of 500 µm were immersed in the mixture solution of buffered hydrofluoric acid (a mixture solution of 4.5% hydrofluoric acid and 36% ammonium fluoride) and alcohol (black circles) at the room temperature without agitation. The reduction in the thickness of the non-porous Si was then measured. The non-porous Si was only etched to 50 Å or less after elapse of 120 minutes.

The etched test pieces of porous Si and non-porous Si were then rinsed with water and the surfaces after the rinsing were examined by microanalysis using secondary ions but no impurity was detected.

The etching rate has dependencies on the solution concentrations of buffered hydrofluoric acid, as well as the temperature. The addition of alcohol serves to remove bubbles of reaction product gases generated as a result of the etching without delay from the surface being etched, without necessitating agitation, thus ensuring a high efficiency and uniformity of the etching for the porous Si.

The conditions for the concentration of etching solution and the temperature can be set to fall within the ranges in which the etching rate would cause no practical inconvenience in commercial production, with an appreciable effect of alcohol. Although the mixture solution (10:1) of buffered hydrofluoric acid (a mixture solution of 4.5% hydrogen fluoride and 36% ammonium fluoride) and ethyl alcohol, as well as the room temperature as the solution temperature, are mentioned as an instance, the present invention is not limited to such conditions.

The HF concentration in the buffered hydrofluoric acid with respect to the etching solution preferably ranges between 1 and 95%, more preferably between 1 and 85%, and most preferably between 1 and 70%. The ammonium fluoride ($NH_4F$) concentration in the buffered hydrofluoric acid with respect to the etching solution preferably ranges between 1 and 95%, more preferably between 5 and 90%, and most preferably between 5 and 80%.

The alcohol concentration with respect to the etching solution is preferably 80% or less, more preferably 60% or less, and most preferably 40% or less, and is determined so as to provide an appreciable effect of alcohol.

The temperature is set in a range of preferably 0° to 100° C., more preferably 5° to 80° C., and most preferably 5° to 60° C.

Although ethyl alcohol has been specifically used in this invention, other alcohols such as isopropyl alcohol, which does not cause any inconvenience in the commercial production and which can provide an appreciable effect of addition of such alcohol, may be used as the alcohol.

(Embodiment 3-6)

The etching can be made using a mixture solution of buffered hydrofluoric acid and hydrogen peroxide, in place of hydrofluoric acid used for an etching solution in embodiments 2-1 and 2-2. In this case, porous Si can be selectively etched with high degrees of efficiency and uniformity, without etching non-porous Si, as in the embodiments 2-1 and 2-2.

The selective etching of porous Si will be described below with the mixture solution of buffered hydrofluoric acid and hydrogen peroxide for use in this embodiment.

Figure 11:
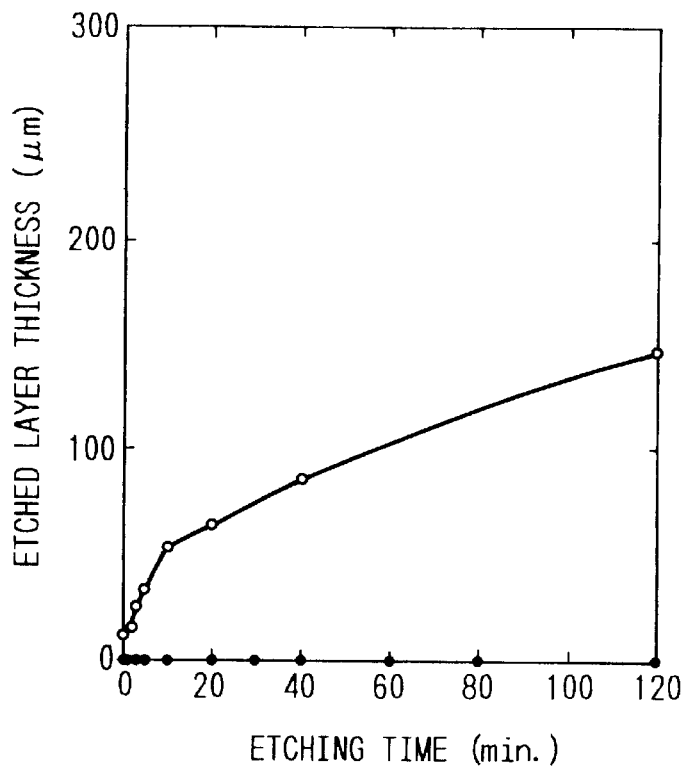
FIG. 11 is a graphic representation showing the etching characteristics of an etching solution applicable to the present invention.

FIG. 11 shows the time dependency of etching thickness of porous Si and monocrystalline Si as observed when the porous Si and the monocrystalline Si are etched by being immersed in the mixture solution (1:5) of buffered hydrofluoric acid (a mixture solution of 4.5% hydrofluoric acid and 36% ammonium fluoride) and 30% hydrogen peroxide and agitated.

The porous Si was formed by anodizing the monocrystalline Si. The conditions of anodization are shown below. It is to be noted, however, that the starting material for producing porous Si by anodization is not limited to monocrystalline Si and Si of other crystalline structure may be used as the starting material.

| Voltage applied: | 2.6 (V) |
|---|---|
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 ($\mu$m) |
| Porosity: | 56 (%) |

Test pieces of the porous Si prepared as described above were immersed, with agitation, in the mixture solution (1:5) of buffered hydrofluoric acid (a mixture solution of 4.5% hydrofluoric acid and 36% ammonium fluoride) and 30% hydrogen peroxide (white circles) at the room temperature. The reduction in the thickness of the porous Si was then measured. The porous Si was rapidly etched: namely, by a layer thickness of 88 $\mu$m in 40 minutes, and further 147 $\mu$m in 120 minutes, with high degrees of surface quality and uniformity. The etching rate has dependencies on the concentration of the etching solution and the temperature.

Test pieces of non-porous Si having a thickness of 500 $\mu$m were immersed in the mixture solution (1:5) of buffered hydrofluoric acid (a mixture solution of 4.5% hydrofluoric acid and 36% ammonium fluoride) and 30% hydrogen peroxide (black circles) at the room temperature and agitated. The reduction in the thickness of the non-porous Si was then measured. The non-porous Si was only etched to 50 Å or less after elapse of 120 minutes.

The etched test pieces of porous Si and non-porous Si were then rinsed with water and the surfaces after the rinsing were examined by microanalysis using secondary ions but no impurity was detected.

Although the solution concentration of hydrogen peroxide was 30% herein, it can be set to fall within the ranges in which it would provide an appreciable effect of the addition of hydrogen peroxide and have no practical inconvenience in commercial production.

The etching rate has dependencies on the solution concentrations of buffered hydrofluoric acid and hydrogen peroxide, as well as the temperature. The addition of hydrogen peroxide solution makes it possible to accelerate the oxidation of silicon, and the reaction speed as compared to the case when it is not added. Further, the reaction speed can be controlled by suitably selecting the content of the hydrogen peroxide.

The conditions for the concentration of etching solution and the temperature can be set to fall within the ranges in which they provide an appreciable effect of buffered hydrofluoric acid and hydrogen peroxide and the etching rate would cause no practical inconvenience in commercial production. Although the mixture solution (1:5) of buffered hydrofluoric acid and hydrogen peroxide, as well as the room temperature as the solution temperature, are mentioned as an instance, the present invention is not limited to such conditions.

The HF concentration in the buffered hydrofluoric acid with respect to the etching solution preferably ranges between 1 and 95%, more preferably between 1 and 85%, and most preferably between 1 and 70%.

The H$_2$O$_2$ concentration with respect to the etching solution preferably ranges between 1 and 95%, more preferably between 5 and 90%, and most preferably between 5 and 80%, and is determined so as to provide an appreciable effect of hydrogen peroxide.

The temperature is set in a range of preferably 0° to 100° C., more preferably 5° to 80° C., and most preferably 5° to 60° C.

(Embodiment 3-7)

The etching can be made using a mixture solution of buffered hydrofluoric acid, alcohol and hydrogen peroxide, in place of hydrofluoric acid used for an etching solution in embodiments 2-1 and 2-2. In this case, porous Si can be selectively etched with high degrees of efficiency and uniformity, without etching non-porous Si, as in the embodiments 2-1 and 2-2.

The selective etching of porous Si will be described below with the mixture solution of buffered hydrofluoric acid, alcohol and hydrogen peroxide for use in this embodiment.

Figure 12:
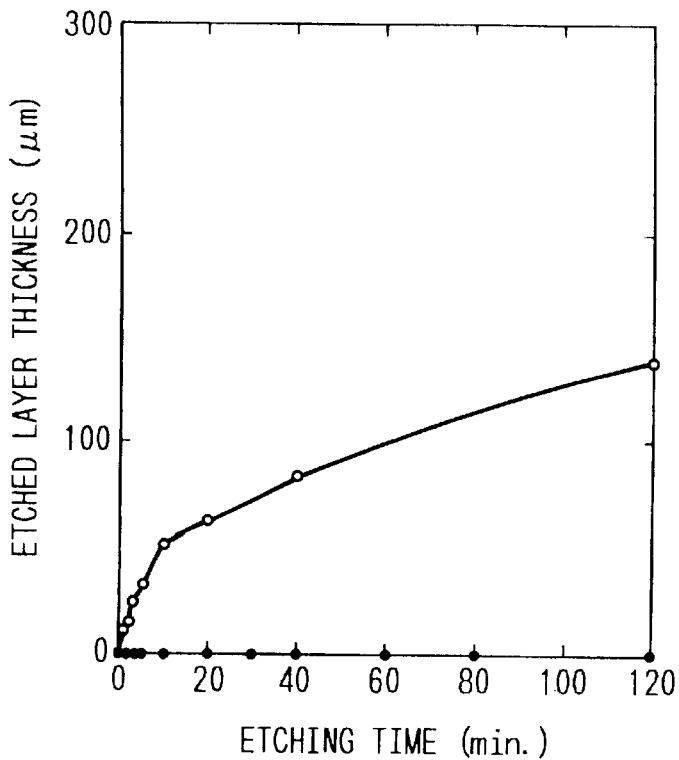
FIG. 12 is a graphic representation showing the etching characteristics of an etching solution applicable to the present invention.

FIG. 12 shows the time dependency of etching thickness of porous Si and monocrystalline Si as observed when the porous Si and the monocrystalline Si are etched by being immersed in the mixture solution (10:6:50) of buffered hydrofluoric acid (a mixture solution of 4.5% hydrofluoric acid and 36% ammonium fluoride), alcohol and 30% hydrogen peroxide without agitation.

The porous Si was formed by anodizing the monocrystalline Si. The conditions of anodization are shown below. It is to be noted, however, that the starting material for producing porous Si by anodization is not limited to monocrystalline Si and Si of other crystalline structure may be used as the starting material.

| Voltage applied: | 2.6 (V) |
|---|---|
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 ($\mu$m) |
| Porosity: | 56 (%) |

Test pieces of the porous Si prepared as described above were immersed, without agitation, in the mixture solution (10:6:50) of buffered hydrofluoric acid (a mixture solution of 4.5% hydrofluoric acid and 36% ammonium fluoride), alcohol and 30% hydrogen peroxide (white circles) at the room temperature. The reduction in the thickness of the porous Si was then measured. The porous Si was rapidly etched: namely, by a layer thickness of 83 $\mu$m in 40 minutes, and further 140 $\mu$m in 120 minutes, with high degrees of surface quality and uniformity. The etching rate has dependencies on the concentration of the etching solution and the temperature.

Test pieces of non-porous Si having a thickness of 500 $\mu$m were immersed in the mixture solution (10:6:50) of buffered hydrofluoric acid (a mixture solution of 4.5% hydrofluoric acid and 36% ammonium fluoride), alcohol and 30% hydrogen peroxide (black circles) at the room temperature without agitation. The reduction in the thickness of the non-porous Si was then measured. The non-porous Si was only etched to 50 Å or less after elapse of 120 minutes. The etched test pieces of porous Si and non-porous Si were then rinsed with water and the surfaces after the rinsing were examined by microanalysis using secondary ions but no impurity was detected.

Although the solution concentration of hydrogen peroxide was 30% herein, it can be set to fall within the ranges in which it would provide an appreciable effect of the addition of hydrogen peroxide and have no practical inconvenience in commercial production.

The etching rate depends on the solution concentrations of hydrofluoric acid and hydrogen peroxide, as well as the temperature. The addition of hydrogen peroxide solution makes it possible to accelerate the oxidation of silicon, and the reaction speed as compared to the case when it is not added. Further, the reaction speed can be controlled by suitably selecting the content of the hydrogen peroxide.

The addition of alcohol serves to remove bubbles of reaction product gases generated as a result of the etching without delay from the surface being etched, without necessitating agitation, thus ensuring a high efficiency and uniformity of the etching for the porous Si.

The conditions for the concentration of etching solution and the temperature can be set to fall within the ranges in which they provide an appreciable effect of buffered hydrofluoric acid, hydrogen peroxide and alcohol, and the etching rate would cause no practical inconvenience in commercial production. Although the mixture solution (10:6:50) of buffered hydrofluoric acid, ethyl alcohol and hydrogen peroxide, as well as the room temperature as the solution temperature, are mentioned as an instance, the present invention is not limited to such conditions.

The HF concentration in the buffered hydrofluoric acid with respect to the etching solution preferably ranges between 1 and 95%, more preferably between 5 and 90%, and most preferably between 5 and 80%. The $H_2O_2$ concentration with respect to the etching solution preferably ranges between 1 and 95%, more preferably between 5 and 90%, and most preferably between 10 and 80%, and is determined so as to provide an appreciable effect of hydrogen peroxide.

The alcohol concentration with respect to the etching solution is preferably 80% or less, more preferably 60% or less, and most preferably 40% or less, and is determined so as to provide an appreciable effect of alcohol.

The temperature is set in a range of preferably 0° to 100° C., more preferably 5° to 80° C., and most preferably 5° to 60° C.

Although ethyl alcohol has been specifically used in this invention, other alcohols such as isopropyl alcohol, which does not cause any inconvenience in the commercial production and which can provide an appreciable effect of addition of such alcohol, may be used as the alcohol.

The specific examples of the present invention will be described below in detail, but the present invention is not limited to those examples.

(EXAMPLE 1)
(example not forming an oxide layer)

This example will be explained in accordance with a process of FIG. 1.

First, anodization was conducted on a P-type or N-type (100) monocrystalline Si substrate having a thickness of 200 μm and a specific resistance of 0.01 Ω.cm in a 50% HF solution. At this time, the current density was 100 mA/cm². Also, the porous structure formation rate was 8.4 μm/min, and hence it took twenty four minutes for the (100) Si substrate having a thickness of 200 μm to be made entirely porous (FIG. 1(a)).

A 0.5 μm thick Si epitaxial layer 13 of 0.063 Ω.cm was grown at a low temperature on the (100) porous Si substrate with MBE (Molecular Beam Epitaxy) method. Deposition was conducted under the following conditions (FIG. 1(b)).

| Temperature: | 700° C. |
|---|---|
| Pressure: | $1 \times 10^{-9}$ Torr |
| Growth rate: | 0.1 nm/sec |

Next, an optically polished fused silica glass substrate 14 was placed on the surface of this epitaxial layer, and contacted thereto (FIG. 1(c)).

The etching speed of the Si monocrystal having a specific resistance of 0.01 Ω.cm with a hydrofluoro-nitro-acetic acid solution (49% hydrofluoric acid: 70% nitric acid: 99.5% acetic acid=1:3:8) is about 1 μm or less per minute, but the Si monocrystal 13 of 0.063 Ω.cm can be hardly etched in this etching solution. The etching speed of the porous layer is increased to about 100 times thereof, as previously described. That is, the porous Si substrate having a thickness of 200 μm was removed in 2 minutes with a result that the monocrystalline Si layer 13 having a thickness of 0.5 μm remained on the fused silica glass substrate 14. There was no change on the epitaxial layer 13. The back surface of the fused silica glass substrate 14 was etched 0.1 μm, but its front surface did not have any difference from its original optical polished face (FIG. 1(d)).

Then, the SOI thin film layer 13 and the fused silica glass substrate 14 were firmly joined by heating them at 800° C. for 0.5 hour in an oxygen atmosphere (FIG. 1(e)).

Observing the cross-section with a transmission electron microscope, it was confirmed that no crystal defects were newly introduced into the Si layer and excellent crystallinity was maintained.

(EXAMPLE 2)

First, anodization was conducted on a P-type or N-type (100) monocrystalline Si substrate having a thickness of 200 μm and a specific resistance of 0.01 Ω.cm in a 50% HF solution. At this time, the current density was 100 mA/cm². Also, the porous structure formation rate was 8.4 μm/min and hence it took twenty four minutes for the (100) Si substrate having a thickness of 200 μm to be made entirely porous (FIG. 1(a)).

A 0.5 μm thick Si epitaxial layer 13 of 0.063 Ω.cm was grown at a low temperature on the (100) porous Si substrate with MBE (Molecular Beam Epitaxy) method. Deposition was conducted under the following conditions (FIG. 1(b)).

| Temperature: | 700° C. |
|---|---|
| Pressure: | $1 \times 10^{-9}$ Torr |
| Growth rate: | 0.1 nm/sec |

Next, the surface of this epitaxial layer was oxidized, and then an optically polished fused silica glass substrate 14 was placed on the surface of the oxidized film, and contacted thereto (FIG. 1(c)).

The etching speed of the Si monocrystal having a specific resistance of 0.01 Ω.cm with a hydrofluoro-nitro-acetic acid solution (49% hydrofluoric acid: 70% nitric acid: 99.5% acetic acid=1:3:8) is about 1 μm or less per minute, but the Si monocrystal 13 of 0.063 Ω.cm can be hardly etched in this etching solution. The etching speed of the porous layer is increased to about 100 times thereof, as previously described. That is, the porous Si substrate having a thickness of 200 μm was removed in 2 minutes with a result that the monocrystalline Si layer 13 having a thickness of 0.5 μm remained on the fused silica glass substrate 14. There was no change on the epitaxial layer 13. The back surface of the fused silica glass substrate 14 was etched 0.1 μm, but its front surface did not have any difference from its original optical polished face (FIG. 1(d)).

Then, the SOI thin film layer 13 and the fused silica glass substrate 14 were firmly joined by heating them at 800° C. for 0.5 hour in an oxygen atmosphere (FIG. 1(e)).

Observing the cross-section with a transmission electron microscope, it was confirmed that no crystal defects were newly introduced into the Si layer, and excellent crystallinity was maintained.

(EXAMPLE 3)

This example was carried out in accordance with a process of FIG. 1.

First, anodization was conducted on a P-type or high-density N-type (100) monocrystalline Si substrate having a thickness of 200 μm in a 50% HF solution. At this time, the current density was 100 mA/cm$^2$. Also, the porous structure formation rate was 8.4 μm/min and hence it took twenty four minutes for the (100) Si substrate having a thickness of 200 μm to be made entirely porous (FIG. 1(a)).

A 0.5 μm thick Si epitaxial layer was grown at a low temperature on the (100) porous Si substrate with plasma CVD method. Deposition was conducted under the following conditions (FIG. 1(b)).

| Gas: | SiH$_4$ |
|---|---|
| High-frequency power: | 100 W |
| Temperature: | 800° C. |
| Pressure: | 1 × 10$^{-9}$ Torr |
| Growth rate: | 2.5 mn/sec |

Next, the surface of this epitaxial layer was oxidized, and then an optically polished glass substrate having a softening point of about 500° C. was placed on the surface of the oxidized film, and contacted thereto (FIG. 1(c)).

The etching speed of the normal Si monocrystal with a KOH 6M solution is about 1 μm or less per minute, but the etching speed of the porous layer is increased to about 100 times thereof, as previously described. That is, the 200 μm thick porous Si substrate was removed in 2 minutes with a result that the 0.5 μm thick monocrystalline Si layer remained on the glass substrate having a low softening point. There was no change on the epitaxial layer. (FIG. 1(d)) Then, the SOI thin film layer and the glass substrate having a low softening point were firmly joined by heating them at 450° C. for 0.5 hour in an oxygen atmosphere (FIG. 1(e)).

Observing the cross-section with a transmission electron microscope, it was confirmed that no crystal defects were newly introduced into the Si layer, and excellent crystallinity was maintained.

(EXAMPLE 4)

First, anodization was conducted on a P-type or high-density N-type (100) monocrystalline Si substrate having a thickness of 200 μm in a 50% HF solution. At this time, the current density was 100 mA/cm$^2$. Also, the porous structure formation rate was 8.4 μm/min and hence it took twenty four minutes for the (100) Si substrate having a thickness of 200 μm to be made entirely porous (FIG. 1(a)).

A 1 μm thick Si epitaxial layer was grown at a low temperature on the (100) porous Si substrate with bias sputtering method. Deposition was conducted under the following conditions (FIG. 1(b)).

| RF frequency: | 100 MHz |
|---|---|
| High-frequency power: | 600 W |
| Temperature: | 300° C. |
| Ar gas pressure: | 8 × 10$^{-3}$ Torr |
| Growth time: | 60 min. |
| Target d.c. bias: | −200 V |
| Substrate d.c. bias: | +5 V |

Next, the surface of this epitaxial layer was oxidized, and then an optically polished glass substrate having a softening point of about 500° C. was placed on the surface of the oxidized film, and contacted thereto (FIG. 1(c)).

The etching speed of the normal Si monocrystal with an NaOH 7M solution is about 1 μm or less per minute, but the etching speed of the porous layer is increased to about 100 times thereof, as previously described. That is, the 200 μm thick porous Si substrate was removed in 2 minutes with a result that the 1 μm thick monocrystalline Si layer remained on the glass substrate having a low softening point. There was no change on the epitaxial layer (FIG. 1(d)).

Then, the SOI thin film layer and the glass substrate having a low softening point were firmly joined by heating them at 450° C. for 0.5 hour in an oxygen atmosphere (FIG. 1(e)).

Observing the cross-section with a transmission electron microscope, it was confirmed that no crystal defects were newly introduced into the Si layer, and excellent crystallinity was maintained.

(EXAMPLE 5)

This example was also carried out in accordance with a process of FIG. 1.

Anodization was conducted on a P-type or N-type (100) monocrystalline Si substrate having a thickness of 200 μm and a specific resistance of 0.01 Ω.cm in a 50% HF solution. At this time, the current density was 100 mA/cm$^2$. Also, the porous structure formation rate was 8.4 μm/min and hence it took twenty four minutes for the (100) Si substrate having a thickness of 200 μm to be made entirely porous.

A 0.5 μm thick Si epitaxial layer 13 of 0.063 Ω.cm was grown at a low temperature on the (100) porous Si substrate with liquid phase growth method. Deposition was conducted under the following conditions.

| Solvent: | Sn |
|---|---|
| Growth temperature: | 900° C. |
| Growth atmosphere: | H$_2$ |
| Growth time: | 10 min. |

Next, the surface of this epitaxial layer was oxidized, and then an optically polished glass substrate having a softening point of about 800° C. was placed on the surface of the oxidized film, and contacted thereto.

The etching speed of the Si monocrystal having a specific resistance of 0.01 Ω.cm with a hydrofluoro-nitro-acetic acid solution (49% hydrofluoric acid: 70% nitric acid: 99.5% acetic acid=1:3:8) is about 1 μm or less per minute, but the Si monocrystal 13 of 0.063 Ω.cm can be hardly etched in this etching solution. The etching speed of the porous layer is increased to about 100 times thereof, as previously described. That is, the porous Si substrate having a thickness of 200 μm was removed in 2 minutes with a result that the monocrystalline Si layer 13 having a thickness of 0.5 μm remained on the glass substrate. There was no change on the epitaxial layer. The back surface of the fused silica glass substrate was etched 0.1 μm, but its front surface did not have any difference from its original optical polished face.

Then, the SOI thin film layer and the glass substrate were firmly joined by heating them at 750° C. for 0.5 hour in an oxygen atmosphere.

Observing the cross-section with a transmission electron microscope, it was confirmed that no crystal defects were newly introduced into the Si layer, and excellent crystallinity was maintained.

(EXAMPLE 6)

This example was also carried out in accordance with a process of FIG. 1.

Anodization was conducted on a P-type or N-type (100) monocrystalline Si substrate having a thickness of 200 μm in a 50% HF solution. At this time, the current density was 100 mA/cm². Also, the porous structure formation rate was 8.4 μm/min and hence it took twenty four minutes for the (100) Si substrate having a thickness of 200 μm to be made entirely porous.

A 0.5 μm thick Si epitaxial layer was grown at a low temperature on the (100) porous Si substrate with low-pressure CVD method. Deposition was conducted under the following conditions.

| Source gas: | SiH$_4$ |
|---|---|
| Carrier gas: | H$_2$ |
| Temperature: | 850° C. |
| Pressure: | 1 × 10$^{-2}$ Torr |
| Growth rate: | 3.3 nm/sec |

Next, the surface of this epitaxial layer was oxidized, and then an optically polished fused silica glass substrate was placed on the surface of the oxidized film, and contacted thereto.

The etching speed of the normal Si monocrystal with a hydrofluoro-nitric acid solution (40% hydrofluoric acid: 65% nitric acid: water=6:100:40) is about 0.5 μm or less per minute. The etching speed of the porous layer is increased to about 100 times thereof, as previously described. That is, the porous Si substrate having a thickness of 200 μm was removed in 4 minutes with a result that the monocrystalline Si layer having a thickness of 0.5 μm remained on the fused silica glass substrate. There was no change on the epitaxial layer. The back surface of the fused silica glass substrate was hardly etched but its front surface did not have any difference from its original optical polished face.

When SiH$_2$Cl$_2$ was as a source gas, high-speed etching characteristics specific to the porous substrate were maintained, although the growth temperature must be elevated several tens degrees.

Then, the SOI thin film layer and the fused silica glass substrate were firmly joined by heating them at 800° C. for 0.5 hour in a nitrogen atmosphere.

Observing the cross-section with a transmission electron microscope, it was confirmed that no crystal defects were newly introduced into the Si layer, and excellent crystallinity was maintained.

(EXAMPLE 7)
example of not forming an oxide layer)

This example was also carried out in accordance with a process of FIG. 2.

First, a 1.0 μm thick Si epitaxial layer was grown on a P-type or N-type (100) monocrystalline Si substrate having a thickness of 200 μm and a specific resistance of 0.01 Ω.cm by CVD method. Deposition was conducted under the following conditions:

| Reactive gas flow rate: | SiH$_2$Cl$_2$ 1000 SCCM |
|---|---|
| | H$_2$ 230 liter/min |
| Temperature: | 1080° C. |
| Pressure: | 760 Torr |
| Time: | 2 min |

Anodization was conducted on this substrate in a 50% HF solution. At this time, the current density was 100 mA/cm². The porous structure formation rate was 8.4 μm/min and hence it took twenty four minutes for the (100) Si substrate having a thickness of 200 μm to be made entirely porous. This anodization made the (100) Si substrate porous, and there was no change in the Si epitaxial layer (FIG. 2(b)).

Then, an optically polished fused silica glass substrate was placed on the surface of the epitaxial layer, and contacted thereto (FIG. 2(c)).

The etching speed of the Si monocrystal having a specific resistance of 0.01 Ω.cm with a hydrofluoro-nitro-acetic acid solution (40% hydrofluoric acid: 65% nitric acid: 99.5% acetic acid=1:3:8) is about 1 μm or less per minute, but the Si monocrystal of 0.063 Ω.cm is hardly etched in this etching solution. The etching speed of the porous layer is increased to about 100 times thereof, as previously described. That is, the porous Si substrate having a thickness of 200 μm was removed in 2 minutes with a result that the monocrystalline Si layer having a thickness of 1 μm remained on the fused silica glass substrate. There was no change on the epitaxial layer. The back surface of the fused silica glass substrate was etched 0.1 μm, but its front surface did not have any difference from its original optical polished face (FIG. 2(d)).

Then, the SOI thin film layer and the fused silica glass substrate were firmly joined by heating them at 800° C. for 0.5 hour in an oxygen atmosphere (FIG. 2(e)).

Observing the cross-section with a transmission electron microscope, it was confirmed that no crystal defects were newly introduced into the Si layer, and excellent crystallinity was maintained.

(EXAMPLE 8)

First, a 1.0 μm thick Si epitaxial layer was grown on a P-type or N-type (100) monocrystalline Si substrate having a thickness of 200 μm and a specific resistance of 0.01 Ω.cm by CVD method. Deposition was conducted under the following conditions:

| Reactive gas flow rate: | SiH$_2$Cl$_2$ 1000 SCCM |
|---|---|
| | H$_2$ 230 liter/min |
| | PH$_3$ (500 ppm) 72 SCCM |
| Temperature: | 1080° C. |
| Pressure: | 760 Torr |
| Time: | 2 min |

Anodization was conducted on this substrate in a 50% HF solution. At this time, the current density was 100 mA/cm². The porous structure formation rate was 8.4 μm/min and hence it took twenty four minutes for the (100) Si substrate having a thickness of 200 μm to be made entirely porous. As mentioned above, this anodization made only the (100) Si substrate porous, and there was no change in the Si epitaxial layer (FIG. 2(b)).

Next, the surface of this epitaxial layer was oxidized, and then an optically polished fused silica glass substrate was placed on the surface of the oxide film, and contacted thereto (FIG. 2(c)).

The etching speed of the Si monocrystal having a specific resistance of 0.01 Ω.cm with a hydrofluoro-nitro-acetic acid solution (49% hydrofluoric acid: 70% nitric acid: 99.5% acetic acid=1:3:8) is about 1 µm or less per minute, but the Si monocrystal of 0.063 Ω.cm is hardly etched in this etching solution. The etching speed of the porous layer is increased to about 100 times thereof, as previously described. That is, the porous Si substrate having a thickness of 200 µm was removed in 2 minutes with a result that the monocrystalline Si layer having a thickness of 1 µm remained on the fused silica glass substrate. There was no change on the epitaxial layer. The back surface of the fused silica glass substrate was etched 0.1 µm, but its front surface did not have any difference from its original optical polished face (FIG. 2(d)).

Then, the SOI thin film layer and the fused silica glass substrate were firmly joined by heating them at 800° C. for 0.5 hour in an oxygen atmosphere (FIG. 2(e)).

Observing the cross-section with a transmission electron microscope, it was confirmed that no crystal defects were newly introduced into the Si layer, and excellent crystallinity was maintained.

(EXAMPLE 9)

This example was also carried out in accordance with a process of FIG. 2.

First, a 0.5 µm thick Si epitaxial layer was grown on a P-type or high-density N-type (100) monocrystalline Si substrate having a thickness of 200 µm by CVD method. Deposition was conducted under the following conditions:

| Reactive gas flow rate: | $SiH_2Cl_2$ 1000 SCCM |
| --- | --- |
| | $H_2$ 230 liter/min |
| | $PH_3$ (500 ppm) 72 SCCM |
| Temperature: | 1080° C. |
| Pressure: | 80 Torr |
| Time: | 2 min |

Anodization was conducted on this substrate in a 50% HF solution. At this time, the current density was 100 mA/cm². The porous structure formation rate was 8.4 µm/min and hence it took twenty four minutes for the (100) Si substrate having a thickness of 200 µm to be made entirely porous. As mentioned above, this anodization made only the (100) Si substrate porous, and there was no change in the Si epitaxial layer.

Next, the surface of this epitaxial layer was oxidized, and then an optically polished fused silica glass substrate was placed on the surface of the oxide film, and contacted thereto.

The etching speed of the normal Si monocrystal with a hydrofluoro-nitric acid solution (40% hydrofluoric acid: 65% nitric acid: water=6:100:40) is about 0.5 µm or less per minute. The etching speed of the porous layer is increased to about 100 times thereof, as previously described. That is, the porous Si substrate having a thickness of 200 µm was removed in 4 minutes with a result that the monocrystalline Si layer having a thickness of 0.5 µm remained on the fused silica glass substrate. There was no change on the epitaxial layer. The back surface of the fused silica glass substrate was hardly etched but its front surface did not have any difference from its original optical polished face.

Then, the SOI thin film layer and the fused silica glass substrate were firmly joined by heating them at 800° C. for 0.5 hour in a nitrogen atmosphere.

Observing the cross-section with a transmission electron microscope, it was confirmed that no crystal defects were newly introduced into the Si layer, and excellent crystallinity was maintained.

(EXAMPLE 10)

This example was also carried out in accordance with a process of FIG. 2.

A 0.5 µm thick Si epitaxial layer was grown on a P-type or high-density N-type (100) monocrystalline Si substrate having a thickness of 200 µm by MBE method. Deposition was conducted under the following conditions:

| Temperature: | 700° C. |
| --- | --- |
| Pressure: | $1 \times 10^{-9}$ Torr |
| Growth rate: | 0.1 nm/sec |

Anodization was conducted on this substrate in a 50% HF solution. At this time, the current density was 100 mA/cm². The porous structure formation rate was 8.4 µm/min and hence it took twenty four minutes for the (100) Si substrate having a thickness of 200 µm to be made entirely porous. As mentioned above, this anodization made only the (100) Si substrate porous, and there was no change in the Si epitaxial layer.

Next, the surface of this epitaxial layer was oxidized, and then an optically polished glass substrate having a softening point of about 800° C. was placed on the surface of the oxide film, and contacted thereto.

The etching speed of the normal Si monocrystal with a hydrofluoro-nitric acid solution (40% hydrofluoric acid: 65% nitric acid: water=6:100:40) is about 0.5 µm or less per minute. The etching speed of the porous layer is increased to about 100 times thereof, as previously described. That is, the porous Si substrate having a thickness of 200 µm was removed in 4 minutes with a result that the monocrystalline Si layer having a thickness of 0.5 µm remained on the fused silica glass substrate. There was no change on the epitaxial layer. The back surface of the glass substrate was hardly etched but its front surface did not have any difference from its original optical polished face.

Then, the SOI thin film layer and the glass substrate were firmly joined by heating them at 750° C. for 0.5 hour in an oxygen atmosphere.

Observing the cross-section with a transmission electron microscope, it was confirmed that no crystal defects were newly introduced into the Si layer, and excellent crystallinity was maintained.

(EXAMPLE 11)

This example was carried out in accordance with a process of FIG. 1.

A 1 µm thick N-type Si layer was formed on the surface of a P-type (100) monocrystal Si substrate having a thickness of 200 µm and a specific resistance of 0.01 Ω.cm by proton implantation. Implantation rate of $H^+$ was $5 \times 10^{15}$ (ions/cm²). Anodization was conducted on this substrate in a 50% HF solution. At this time, the current density was 100 mA/cm². The porous structure formation rate was 8.4 µm/min and hence it took twenty four minutes for the P-type (100) Si substrate having a thickness of 200 µm to be made entirely porous. As mentioned above, this anodization made only the P-type (100) Si substrate porous, and there was no change in the N-type Si layer.

Next, the surface of this epitaxial layer was oxidized, and then an optically polished fused silica glass substrate was placed on the surface of the oxide film, and contacted thereto.

The etching speed of the Si monocrystal having a specific resistance of 0.01 Ω.cm with a hydrofluoro-nitric acid solution (49% hydrofluoric acid: 70% nitric acid: 99.5% acetic acid=1:3:8) is about 1 μm or less per minute, but the Si monocrystal of 0.063 Ω.cm is hardly etched in this etching solution. The etching speed of the porous layer is increased to about 100 times thereof, as previously described. That is, the porous Si substrate having a thickness of 200 μm was removed in 2 minutes with a result that the monocrystalline Si layer having a thickness of 1 μm remained on the fused silica glass substrate. There was no change on the epitaxial layer. The back surface of the fused silica glass substrate was etched 0.1 μm but its front surface did not have any difference from its original optical polished face.

Then, the SOI thin film layer and the fused silica glass substrate were firmly joined by heating them at 800° C. for 0.5 hour in an oxygen atmosphere.

Observing the cross-section with a transmission electron microscope, it was confirmed that no crystal defects were newly introduced into the Si layer, and excellent crystallinity was maintained.

(EXAMPLE 12)

This example was carried out in accordance with a process of FIG. 2.

A 1 μm thick high resistive Si layer having a specific resistance of 0.063 Ω.cm was formed on the surface of a P-type (100) monocrystal Si substrate having a thickness of 200 μm and a specific resistance of 0.01 Ω.cm by ion implantation of $P^+$ (phosphorous ion). Implantation rate of $P^+$ was $5 \times 10^{15}$ (ions/cm$^2$). Anodization was conducted on this substrate in a 50% HF solution. At this time, the current density was 100 mA/cm$^2$. The porous structure formation rate was 8.4 μm/min and hence it took twenty four minutes for the low resistive P-type (100) Si substrate having a thickness of 200 μm to be made entirely porous. As mentioned above, this anodization made only the low resistive P-type (100) Si substrate porous, and there was no change in the high resistive Si layer.

Next, the surface of this epitaxial layer was oxidized, and then an optically polished fused silica glass substrate was placed on the surface of the oxide film, and contacted thereto.

The etching speed of the Si monocrystal having a specific resistance of 0.01 Ω.cm with a hydrofluoro-nitro-acetic acid solution (49% hydrofluoric acid: 70% nitric acid: 99.5% acetic acid=1:3:8) is about 1 μm or less per minute, but the Si monocrystal of 0.063 Ω.cm is hardly etched in this etching solution. The etching speed of the porous layer is increased to about 100 times thereof, as previously described. That is, the porous Si substrate having a thickness of 200 μm was removed in 2 minutes with a result that the monocrystalline Si layer having a thickness of 1 μm remained on the fused silica glass substrate. There was no change on the epitaxial layer. The back surface of the fused silica glass substrate was etched 0.1 μm but its front surface did not have any difference from its original optical polished face.

Then, the SOI thin film layer and the fused silica glass substrate were firmly joined by heating them at 800° C. for 0.5 hour in an oxygen atmosphere.

Observing the cross-section with a transmission electron microscope, it was confirmed that no crystal defects were newly introduced into the Si layer, and excellent crystallinity was maintained.

(EXAMPLE 13)

First, anodization was conducted on a P-type or N-type (100) monocrystalline Si substrate having a thickness of 200 μm and a specific resistance of 0.01 Ω.cm in an HF solution to make the substrate porous. The conditions of anodization are as follows.

| | |
|---|---|
| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 1.6 (hour) |
| Thickness of porous Si: | 200 (μm) |
| Porosity: | 56 (%) |

A 0.5 μm thick Si epitaxial layer (non-porous Si monocrystalline layer) of 0.063 Ω.cm was grown at a low temperature on the (100) porous Si substrate by MBE (Molecular Beam Epitaxy) method. Deposition was conducted under the following conditions.

| | |
|---|---|
| Temperature: | 700° C. |
| Pressure: | $1 \times 10^{-9}$ Torr |
| Growth rate: | 0.1 nm/sec |

Next, the surface of this epitaxial layer was oxidized 1000 Å, and then an optically polished fused silica glass substrate was placed on the surface of the oxide film, and contacted thereto (primary bonding). The fused silica glass substrate was only covered with Si$_3$N$_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the non-porous monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer remained on the fused silica glass substrate after the removal of Si$_3$N$_4$ coating film. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

Coating of Apiezon Wax can be used in place of the Si$_3$N$_4$ coated film.

(EXAMPLE 14)

First, anodization was conducted on a P-type or high-density N-type (100) monocrystalline Si substrate having a thickness of 200 μm in an HF solution to make the substrate porous.

The conditions of anodization were the same as those shown in example 13.

A 0.5 $\mu$m thick Si epitaxial layer (non-porous Si monocrystalline layer) was grown at a low temperature on the (100) porous Si substrate by a plasma CVD method. Deposition was conducted under the following conditions.

| Gas: | SiH$_4$ |
|---|---|
| High-frequency power: | 100 W |
| Temperature: | 800° C. |
| Pressure | 1 × 10$^{-2}$ Torr |
| Growth rate | 2.5 nm/sec |

Next, the surface of this epitaxial layer was oxidized 1000 Å, and then an optically polished glass substrate having a softening point of about 500° C. was placed on the surface of the oxide film, and contacted thereto (primary bonding). Then, the glass substrate was only covered with Si$_3$N$_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50Å of non-porous monocrystalline Si was removed in seventy eight minutes. Since the ratio of the etching rate of the non-porous monocrystalline Si to that of the porous layer is 1:10$^5$, the amount of non-porous layer which is etched (several tens angstroms) can be ignored in a practical operation.

That is, the 200 $\mu$m-thick porous Si substrate was removed with a result that the 0.5 $\mu$m-thick monocrystalline Si layer remained on the glass substrate having a low softening point after the removal of Si$_3$N$_4$ coating film. There was no change on the epitaxial layer.

Then, the SOI thin film layer and the glass substrate having a low softening point were firmly joined by heating them at 450° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 15)

First, anodization was conducted on a P-type or high-density N-type (100) monocrystalline Si substrate having a thickness of 200 $\mu$m in an HF solution to make the substrate porous.

The conditions of anodization were the same as those shown in example 13.

A 1 $\mu$m thick Si epitaxial layer (non-porous Si monocrystalline layer) was grown at a low temperature on the (100) porous Si substrate by bias sputtering. Deposition was conducted under the following conditions.

| RF frequency: | 100 MHz |
|---|---|
| High-frequency power: | 600 W |
| Temperature: | 300° C. |
| Ar gas pressure: | 8 × 10$^{-3}$ Torr |
| Growth rate: | 60 min. |
| Target d.c. bias: | −200 V |
| Substrate d.c. bias: | +5 V |

Next, the surface of this epitaxial layer was oxidized 1000 Å, and then an optically polished glass substrate having a softening point of about 500° C. was placed on the surface of the oxide film, and contacted thereto (primary bonding). The glass substrate was only covered with Si$_3$N$_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is 1:10$^5$, the amount of non-porous layer which is etched (several tens angstroms) can be ignored in a practical operation.

That is, the 200 $\mu$m-thick porous Si substrate was removed with a result that the 1 $\mu$m-thick monocrystalline Si layer remained on the glass substrate having a low softening point after the removal of Si$_3$N$_4$ coating film. There was no change on the epitaxial layer.

Then, the SOI thin film layer and the glass substrate having a low softening point were firmly joined by heating them at 450° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 16)

First, anodization was conducted on a P-type or N-type (100) monocrystalline Si substrate having a thickness of 200 $\mu$m and a specific resistance of 0.01 $\Omega$.cm in an HF solution to make the substrate porous.

The conditions of anodization were the same as those shown in example 13.

A 0.5 $\mu$m thick Si epitaxial layer (non-porous Si monocrystalline layer) of 0.063 $\Omega$.cm was grown at a low temperature on the (100) porous Si substrate by liquid phase growth. Deposition was conducted under the following conditions.

| Solvent: | Sn |
|---|---|
| Growth temperature: | 900° C. |
| Growth atmosphere: | H$_2$ |
| Growth rate: | 10 min. |

Next, the surface of this epitaxial layer was oxidized 1000 Å, and then an optically polished glass substrate having a softening point of about 800° C. was placed on the surface of the oxide film, and contacted thereto (primary bonding). The glass substrate was only covered with Si$_3$N$_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer remained on the glass substrate after the removal of $Si_3N_4$ coating film. There was no change on the epitaxial layer.

Then, the SOI thin film layer and the glass substrate were firmly joined by heating them at 750° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 17)

First, anodization was conducted on a P-type or N-type (100) monocrystalline Si substrate having a thickness of 200 μm in an HF solution to make the substrate porous.

The conditions of anodization were the same as those shown in example 13.

A 0.5 μm thick Si epitaxial layer (non-porous Si monocrystalline layer) was grown at a low temperature on the (100) porous Si substrate by liquid phase growth. Deposition was conducted under the following conditions.

| Source gas: | $SiH_4$ |
|---|---|
| Carrier gas: | $H_2$ |
| Temperature: | 850° C. |
| Pressure: | $1 \times 10^{-2}$ Torr |
| Growth rate: | 3.3 nm/sec |

Next, the surface of this epitaxial layer was oxidized 1000 Å, and then an optically polished fused silica glass substrate was placed on the surface of the oxide film, and contacted thereto (primary bonding). The fused silica glass substrate was only covered with $Si_3N_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer on the fused silica glass substrate remained after the removal of $Si_3N_4$ coating film. There was no change on the epitaxial layer.

When $SiH_2Cl_2$ was used as the source gas, the growth temperature had to be higher by several tens of degrees. However, high-speed etching characteristics to the porous substrate did not deteriorate.

Then, the SOI thin film layer and the fused silica glass substrate were firmly joined by heating them at 800° C. for 0.5 hour in a nitrogen atmosphere (secondary bonding).

Observing the cross-section with a transmission electron microscope, it was confirmed that no crystal defects were newly introduced into the Si layer, and excellent crystallinity was maintained.

(EXAMPLE 18)

A 1 μm thick Si epitaxial layer (non-porous Si monocrystalline layer) was grown on the P-type or N-type (100) monocrystalline Si substrate having a thickness of 200 μm and a specific resistance of 0.01 Ω.cm by CVD method. Deposition was conducted under the following conditions.

| Reactive gas flow rate: | $SiH_2Cl_2$ 1000 SCCM |
|---|---|
| | $H_2$ 230 1/min. |
| | $PH_3$ (50 ppm) 72 SCCM |
| Temperature: | 1080° C. |
| Pressure: | 80 Torr |
| Time: | 2 min. |

Anodization was conducted on the substrate in an HF solution to make the substrate porous.

The conditions of anodization were the same as those shown in example 13.

As mentioned above, anodization made only the (100) Si substrate porous, and did not affect the Si epitaxial layer (non-porous Si monocrystalline layer).

Next, the surface of this epitaxial layer was oxidized 1000 Å, and then an optically polished fused silica glass substrate was placed on the surface of the oxide film, and contacted thereto (primary bonding). The fused silica glass substrate was only covered with $Si_3N_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 1 μm-thick monocrystalline Si layer on the fused silica glass substrate remained after the removal of $Si_3N_4$ coating film. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 19)

A 0.5 μm thick Si epitaxial layer (non-porous Si monocrystalline layer) was grown on the P-type or high-density N-type (100) monocrystalline Si substrate having a thickness of 200 μm by CVD method. Deposition was conducted under the following conditions.

| Reactive gas flow rate: | $SiH_2Cl_2$ 1000 SCCM |
| --- | --- |
| | $H_2$ 230 1/min. |
| | $PH_3$ (50 ppm) 72 SCCM |
| Temperature: | 1080° C. |
| Pressure: | 80 Torr |
| Time: | 1 min. |

Anodization was conducted on the substrate in an HF solution to make the substrate porous.

The conditions of anodization were the same as those shown in example 13.

As mentioned above, anodization made only the (100) Si substrate porous, and did not affect the Si epitaxial layer (non-porous Si monocrystalline layer).

Next, the surface of this epitaxial layer was oxidized 1000 Å, and then an optically polished fused silica glass substrate was placed on the surface of the oxide film, and contacted thereto (primary bonding). The fused silica glass substrate was only covered with $Si_3N_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer on the fused silica glass substrate remained after the removal of $Si_3N_4$ coating film. There was no change on the epitaxial layer.

Then, the SOI thin film layer and the fused silica glass substrate were firmly joined by heating them at 800° C. for 0.5 hour in a nitrogen atmosphere (secondary bonding).

Observing the cross-section with a transmission electron microscope, it was confirmed that no crystal defects were newly introduced into the Si layer, and excellent crystallinity was maintained.

(EXAMPLE 20)

A 0.5 μm thick Si epitaxial layer (non-porous Si monocrystalline layer) was grown on the P-type or high-density N-type (100) monocrystalline Si substrate having a thickness of 200 μm by MBE method. Deposition was conducted under the following conditions.

| Temperature: | 700° C. |
| --- | --- |
| Pressure: | $1 \times 10^{-9}$ Torr |
| Growth rate: | 0.1 nm/sec |

Anodization was conducted on the substrate in an HF solution to make the substrate porous.

The conditions of anodization were the same as those shown in example 13.

As mentioned above, anodization made only the (100) Si substrate porous, and did not affect the Si epitaxial layer (non-porous Si monocrystalline layer).

Next, the surface of this epitaxial layer was oxidized, and then an optically polished glass substrate having a softening point of about 800° C. was placed on the surface of the oxide film, and contacted thereto (primary bonding). The glass substrate was only covered with $Si_3N_4$ which is excellent for chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer on the fused silica glass substrate remained after the removal of $Si_3N_4$ coating film. There was no change on the epitaxial layer.

Then, the SOI thin film layer and the glass substrate were firmly joined by heating them at 750° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 21)

A 1 μm thick N-type Si layer was grown on the surface of a P-type (100) monocrystalline Si substrate having a thickness of 200 μm and a specific resistance of 0.01 Ω.cm by proton implantation. Implantation rate of $H^+$ was $5\times10^{15}$ (ions/cm$^2$). Anodization was conducted on the substrate in an HF solution to make the substrate porous.

The conditions of anodization were the same as those shown in example 13.

As mentioned above, anodization made only the P-type (100) Si substrate porous, and did not affect the N-type Si layer.

Next, the surface of this N-type Si layer was oxidized 1000 Å, and then an optically polished fused silica glass substrate was placed on the surface of the oxide film, and contacted thereto (primary bonding). The fused silica glass substrate was only covered with $Si_3N_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 1 μm-thick monocrystalline Si layer on the fused silica glass substrate remained after the removal of $Si_3N_4$ coating film. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 22)

A 1 μm thick high-resistance Si layer having a specific resistance of 0.063 Ω.cm was formed on the surface of a P-type (100) monocrystalline Si substrate having a thickness of 200 μm and a specific resistance of 0.01 Ω.cm by ion implantation of $P^+$ (phosphorus ion). Implantation rate of $P^+$ was $5 \times 10^{15}$ (ions/cm$^2$). Anodization was conducted on the substrate in an HF solution to make the substrate porous.

The conditions of anodization were the same as those shown in example 13.

As mentioned above, anodization made only the low-resistance P-type (100) Si substrate porous, and did not affect the high-resistance Si layer.

Next, the surface of this high-resistance Si layer was oxidized 1000 Å, and then an optically polished fused silica glass substrate was placed on the surface of the oxide film, and contacted thereto (primary bonding). The fused silica glass substrate was only covered with $Si_3N_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 1 μm-thick monocrystalline Si layer on the fused silica glass substrate remained after the removal of $Si_3N_4$ coating film. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 23)

First, anodization was conducted on a P-type or N-type (100) monocrystalline Si substrate having a thickness of 200 μm and a specific resistance of 0.01 Ω.cm in an HF solution to make the substrate porous.

The conditions of anodization were the same as those shown in example 13.

Then, a 0.5 μm Si epitaxial layer (non-porous Si monocrystalline layer) was grown at a low temperature on the (100) porous Si substrate by MBE (Molecular Beam Epitaxy) method. Deposition was conducted under the following conditions.

| | |
|---|---|
| Temperature: | 700° C. |
| Pressure: | $1 \times 10^{-9}$ Torr |
| Growth rate: | 0.1 nm/sec |

Next, an optically polished fused silica glass substrate was placed on the surface of the epitaxial layer, and contacted thereto (primary bonding). The fused silica glass substrate was only covered with $Si_3N_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the non-porous monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer on the fused silica glass substrate remained after the removal of $Si_3N_4$ coating film. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

Apiezon wax can be used instead of the $Si_3N_4$ coating film.

(EXAMPLE 24)

A 1 μm si epitaxial layer (non-porous Si monocrystalline layer) was grown on a P-type or N-type (100) monocrystalline Si substrate having a thickness of 200 μm and a specific resistance of 0.01 Ω.cm by CVD method. Deposition was conducted under the following conditions.

| Reactive gas flow rate: | SiH$_2$Cl$_2$ 1000 SCCM |
|---|---|
|  | H$_2$ 230 1/min. |
|  | PH$_3$ (50 ppm) 72 SCCM |
| Temperature: | 1080° C. |
| Pressure: | 80 Torr |
| Time: | 2 min. |

Anodization was conducted on this substrate in an HF solution to make the substrate porous.

As mentioned above, anodization made only the (100) Si substrate porous, and did not affect the Si epitaxial layer (non-porous Si monocrystalline layer).

Next, an optically polished fused silica glass substrate was placed on the surface of the epitaxial layer, and contacted thereto (primary bonding). The fused silica glass substrate was only covered with Si$_3$N$_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the non-porous monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is 1:10$^5$, the amount of non-porous layer which is etched (several tens angstroms) can be ignored in a practical operation.

That is, the 200 μm-thick porous Si substrate was removed with a result that the 1 μm-thick monocrystalline Si layer on the fused silica glass substrate remained after the removal of Si$_3$N$_4$ coating film. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

In the above-described examples, a light-transparent substrate was used as an insulating substrate to realize the SOI structure, but it will be appreciated that a light-opaque substrate can be also used with the same effects of the present invention.

Herein, it will be understood that the anti-etching film is not necessary if the light-opaque substrate has a strong resistance to the etching solution of the present invention.

(EXAMPLES 25 TO 36)

Etching was performed in the same manner as that of examples 13 to 24 to form a monocrystalline Si layer with the exception that a mixture solution (10:1) of 49% hydrofluoric acid and alcohol was used as an etchant, instead of an etching solution used in examples 13 to 24. In eighty two minutes after initialization of etching, the porous Si was selectively removed by etching using the mixture solution (10:1) of 49% hydrofluoric acid and alcohol, only the non-porous Si monocrystalline layer being left behind.

The etching rate of the non-porous Si monocrystal with the etching solution was so low that only a maximum of 50 Å of non-porous monocrystalline Si was removed in eighty two minutes. Since the ratio of the etching rate of the non-porous monocrystalline Si to that of the porous layer is 1:10$^5$, the amount of non-porous layer which is etched (several tens angstroms) can be ignored in a practical operation.

Observing the cross-section of a finally obtained Si layer with a transmission electron microscope, it was confirmed that no crystal defects were newly introduced into the Si layer, and excellent crystallinity was maintained.

(EXAMPLES 37 TO 48)

Etching was performed in the same manner as that of examples 13 to 24 to form a monocrystalline Si layer with the exception that a mixture solution (1:5) of 49% hydrofluoric acid and 30% hydrogen peroxide was used as an etchant, instead of an etching solution used in examples 13 to 24. In sixty two minutes after initialization of etching, the porous Si was selectively removed by etching using the mixture solution (1:5) of 49% hydrofluoric acid and 30% hydrogen peroxide, only the non-porous Si monocrystalline layer being left behind.

The etching rate of the non-porous Si monocrystal with the etching solution was so low that only a maximum of 50 Å of non-porous monocrystalline Si was removed in sixty two minutes. Since the ratio of the etching rate of the non-porous monocrystalline Si to that of the porous layer is 1:10$^5$, the amount of non-porous layer which is etched (several tens angstroms) can be ignored in a practical operation.

Observing the cross-section of a finally obtained Si layer with a transmission electron microscope, it was confirmed that no crystal defects were newly introduced into the Si layer, and excellent crystallinity was maintained.

(EXAMPLES 49 TO 60)

Etching was performed in the same manner as that of examples 13 to 24 to form a monocrystalline Si layer with the exception that a mixture solution (10:6:50) of 49% hydrofluoric acid, alcohol and 30% hydrogen peroxide was used as an etchant, instead of an etching solution used in examples 13 to 24. In sixty five minutes after initialization of etching, the porous Si was selectively removed by etching using the mixture solution (10:6:50) of 49% hydrofluoric acid, alcohol and 30% hydrogen peroxide, only the non-porous Si monocrystalline layer being left behind.

The etching rate of the non-porous Si monocrystal with the etching solution was so low that only a maximum of 50 Å of non-porous monocrystalline Si was removed in sixty five minutes. Since the ratio of the etching rate of the non-porous monocrystalline Si to that of the porous layer is 1:10$^5$, the amount of non-porous layer which is etched (several tens angstroms) can be ignored in a practical operation.

Observing the cross-section of a finally obtained Si layer with a transmission electron microscope, it was confirmed that no crystal defects were newly introduced into the Si layer, and excellent crystallinity was maintained.

(EXAMPLES 61 TO 72)

Etching was performed in the same manner as that of examples 13 to 24 to form a monocrystalline Si layer with the exception that a buffered hydrofluoric acid (a mixture solution of 4.5% hydrofluoric acid and 36% ammonium fluoride) was used as an etchant, instead of an etching solution used in examples 13 to 24. In two hundreds fifty eight minutes after initialization of etching, the porous Si was selectively removed by etching using the buffered hydrofluoric acid, only the non-porous Si monocrystalline layer being left behind.

The etching rate of the non-porous Si monocrystal with the etching solution was so low that only a maximum of 50 Å of non-porous monocrystalline Si was removed in two hundreds fifty eight minutes. Since the ratio of the etching rate of the non-porous monocrystalline Si to that of the porous layer is $1:10^5$, the amount of non-porous layer which is etched (several tens angstroms) can be ignored in a practical operation.

Observing the cross-section of a finally obtained Si layer with a transmission electron microscope, it was confirmed that no crystal defects were newly introduced into the Si layer, and excellent crystallinity was maintained.

(EXAMPLES 72 TO 84)

Etching was performed in the same manner as that of examples 13 to 24 to form a monocrystalline Si layer with the exception that a mixture solution (10:1) of a buffered hydrofluoric acid (a mixture solution of 4.5% hydrofluoric acid and 36% ammonium fluoride) and alcohol was used as an etchant, instead of an etching solution used in examples 13 to 24. In two hundreds seventy five minutes after initialization of etching, the porous Si was selectively removed by etching using the mixture solution, only the non-porous Si monocrystalline layer being left behind.

The etching rate of the non-porous Si monocrystal with the etching solution was so low that only a maximum of 50 Å of non-porous monocrystalline Si was removed in two hundreds seventy five minutes. Since the ratio of the etching rate of the non-porous monocrystalline Si to that of the porous layer is $1:10^5$, the amount of non-porous layer which is etched (several tens angstroms) can be ignored in a practical operation.

Observing the cross-section of a finally obtained Si layer with a transmission electron microscope, it was confirmed that no crystal defects were newly introduced into the Si layer, and excellent crystallinity was maintained.

(EXAMPLES 85 TO 96)

Etching was performed in the same manner as that of examples 13 to 24 to form a monocrystalline Si layer with the exception that a mixture solution (1:5) of a buffered hydrofluoric acid (a mixture solution of 4.5% hydrofluoric acid and 36% ammonium fluoride) and 30% hydrogen peroxide was used as an etchant, instead of an etching solution used in examples 13 to 24. In one hundred ninety one minutes after initialization of etching, the porous Si was selectively removed by etching using the mixture solution, only the non-porous Si monocrystalline layer being left behind.

The etching rate of the non-porous Si monocrystal with the etching solution was so low that only a maximum of 50 Å of non-porous monocrystalline Si was removed in one hundred ninety one minutes. Since the ratio of the etching rate of the non-porous monocrystalline Si to that of the porous layer is $1:10^5$, the amount of non-porous layer which is etched (several tens angstroms) can be ignored in a practical operation.

Observing the cross-section of a finally obtained Si layer with a transmission electron microscope, it was confirmed that no crystal defects were newly introduced into the Si layer, and excellent crystallinity was maintained.

(EXAMPLES 97 TO 108)

Etching was performed in the same manner as that of examples 13 to 24 to form a monocrystalline Si layer with the exception that a mixture solution (10:6:50) of a buffered hydrofluoric acid (a mixture solution of 4.5% hydrofluoric acid and 36% ammonium fluoride), alcohol and 30% hydrogen peroxide was used as an etchant, instead of an etching solution used in examples 13 to 24. In two hundreds five minutes after initialization of etching, the porous Si was selectively removed by etching using the mixture solution, only the non-porous Si monocrystalline layer being left behind.

The etching rate of the non-porous Si monocrystal with the etching solution was so low that only a maximum of 50 Å of non-porous monocrystalline Si was removed in two hundreds five minutes. Since the ratio of the etching rate of the non-porous monocrystalline Si to that of the porous layer is $1:10^5$, the amount of non-porous layer which is etched (several tens angstroms) can be ignored in a practical operation.

Observing the cross-section of a finally obtained Si layer with a transmission electron microscope, it was confirmed that no crystal defects were newly introduced into the Si layer, and excellent crystallinity was maintained.

(EXAMPLE 109)

First, anodization was conducted on a P-type or N-type (100) monocrystalline Si substrate having a thickness of 200 μm and a specific resistance of 0.01 Ω·cm in an HF solution to make the substrate porous.

| | |
|---|---|
| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 1.6 (hour) |
| Thickness of porous Si: | 200 (μm) |
| Porosity: | 56 (%) |

A 0.5 μm thick Si epitaxial layer (non-porous Si monocrystalline layer) was grown at a low temperature on the (100) porous Si substrate by MBE (Molecular Beam Epitaxy) method. Deposition was conducted under the following conditions.

| | |
|---|---|
| Temperature: | 700° C. |
| Pressure: | 1 × 10$^{-9}$ Torr |
| Growth rate: | 0.1 nm/sec |

Next, the surface of this epitaxial layer was oxidized 1000 Å, and then an optically polished fused silica glass substrate was placed on the surface of the oxide film, and the bonding strength between the oxide film and the glass substrate was made higher by heating them at 400° C. for one hour in N$_2$ atmosphere (primary bonding). The bonded substrates were not exfoliated.

Next, the fused silica glass substrate was only covered with Si$_3$N$_4$ excellent in the chemical etching resistance.

Thereafter, selective etching was conducted on the bonded substrates in a 49% hydrofluoric acid solution while the solution was being stirred. In seventy eight minutes, the porous Si substrate was completely removed by the selective etching, with the non-porous monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer remained on the fused silica glass substrate after the removal of $Si_3N_4$ coating film. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

(EXAMPLE 110)

First, anodization was conducted on a P-type or N-type (100) monocrystalline Si substrate having a thickness of 200 μm and a specific resistance of 0.01 Ω.cm in an HF solution to make the substrate porous.

The conditions of anodization are as follows.

| | |
|---|---|
| Applied voltage: | 2.6 (V) |
| Current density: | 30 (mA · cm$^{-2}$) |
| Anodizing solution: | HF:$H_2O$:$C_2H_5OH$ = 1:1:1 |
| Time: | 1.6 (hour) |
| Thickness of porous Si: | 200 (μm) |
| Porosity: | 56 (%) |

A 0.5 μm thick Si epitaxial layer (non-porous Si monocrystalline layer) was grown at a low temperature on the (100) porous Si substrate by MBE (Molecular Beam Epitaxy) method. Deposition was conducted under the following conditions.

| | |
|---|---|
| Temperature: | 700° C. |
| Pressure: | $1 \times 10^{-9}$ Torr |
| Growth rate: | 0.1 nm/sec |

Next, the surface of this epitaxial layer was oxidized 1000 Å, and then an Si substrate having a 5000 Å thick thermally oxidized membrane formed thereon was placed on the surface of the oxide film, and the bonding strength between the oxidized membranes was made higher by heating them at 400° C. for two hours in $N_2$ atmosphere (primary bonding). The bonded substrates were not exfoliated.

Thereafter, selective etching was conducted on the bonded substrates in a 49% hydrofluoric acid solution while the solution was being stirred. In seventy eight minutes, the porous Si substrate was completely removed by the selective etching, with the non-porous monocrystal Si acting as an etch stopper, only the non-porous monocrystalline Si layer being left behind.

The etching rate of the non-porous Si monocrystal with the etching solution was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation.

That is, the 200 μm-thick porous Si substrate was removed with a result that the 0.5 μm-thick monocrystalline Si layer remained via a 5000 Å thick oxide film on the Si substrate. There was no change on the epitaxial layer.

Then, the SOI thin film layer and the fused silica glass substrate were firmly joined by heating them at 800° C. for 0.5 hour in an oxygen atmosphere (secondary bonding).

Observing the cross-section with a transmission electron microscope, it was confirmed that no crystal defects were newly introduced into the Si layer, and excellent crystallinity was maintained.

What is claimed is:

1. A method for producing a semiconductor member comprising the steps of:
   forming a first substrate having a porous monocrystalline semiconductor layer and a non-porous monocrystalline semiconductor thin film layer;
   bonding, at a first temperature, said first substrate to an insulating second substrate having a thermal expansion coefficient different from that of said first substrate, to provide a first multi-layer structure wherein said non-porous monocrystalline semiconductor thin film layer is arranged at an inner side thereof;
   removing said porous monocrystalline semiconductor layer from said first multi-layer structure to form a second multi-layer structure; and
   thermally processing by heating said second multi-layer structure at a second temperature, higher than the first temperature, to strengthen the bonding between said second substrate and said non-porous monocrystalline semiconductor thin film layer.

2. A method according to claim 1, wherein said non-porous monocrystalline semiconductor thin film layer has a thickness of 100 μm or less.

3. A method according to claim 1, further comprising a step of oxidizing a surface of said non-porous monocrystalline semiconductor thin film layer to form an oxide film, wherein said oxidizing step is performed before bonding said first substrate to said second substrate.

4. A method according to claim 1, wherein said first and second substrates are bonded through a van der Waals force at a room temperature.

5. A method according to claim 1, wherein the second temperature is within a range 200°–800° C.

6. A method according to claim 1, wherein the thermal processing is conducted in an atmosphere of oxygen.

7. A method according to claim 1, wherein the thermal processing is conducted in an atmosphere of a nitrogen.

8. A method according to claim 1, wherein said second substrate comprises an insulating substrate.

9. A method according to claim 1, wherein said second substrate comprises a light transmissive substrate.

10. A method according to claim 9, wherein said second substrate comprises a glass substrate.

11. A method according to claim 1, including forming said first substrate by modifying a monocrystalline semiconductor substrate into a porous microcrystalline semiconductor layer, and growing epitaxially said non-porous monocrystalline semiconductor thin film layer on said porous monocrystalline semiconductor layer.

12. A method according to claim 11, wherein said non-porous monocrystalline semiconductor thin film layer is formed on the porous monocrystalline semiconductor layer by molecular beam epitaxy, plasma chemical vapor deposition, pressure-reduced chemical vapor deposition, bias sputtering or growing in a liquid phase.

13. A method according to claim 1, wherein said first substrate is formed by a step of counterdoping a surface of a high carrier concentration monocrystalline semiconductor substrate to form said non-porous monocrystalline semiconductor thin film layer having a low carrier concentration, and a step of anodizing the remaining monocrystalline semiconductor substrate to make said substrate porous.

14. A method according to claim 1, wherein said first substrate is formed by a step of injecting protons into a surface of a p-type monocrystalline semiconductor substrate to form a non-porous monocrystalline semiconductor thin film layer of an n-type, and a step of anodizing the remaining monocrystalline semiconductor substrate.

15. A method according to claim 1, wherein said porous monocrystalline semiconductor layer is removed by chemical etching.

16. A method according to claim 15, wherein said porous monocrystalline semiconductor layer comprises a porous silicon monocrystalline layer and said porous silicon microcrystalline layer is removed by etching using an etchant comprising hydrofluoric acid.

17. A method according to claim 16, wherein said etchant further comprises ammonium fluoride.

18. A method according to claim 17, wherein said etchant further comprises hydrogen peroxide.

19. A method according to claim 18, wherein said etchant further comprises alcohol.

20. A method according to claim 17, wherein said enchant further comprises alcohol.

21. A method according to claim 16, wherein said etchant further comprises hydrogen peroxide.

22. A method according to claim 21, wherein said etchant further comprises alcohol.

23. A method according to claim 16, wherein said etchant further comprises alcohol.

24. A method according to claim 15, further comprising the steps of:
forming an etching prevention film on a surface of said first multi-layer structure before the removing of said porous monocrystalline semiconductor layer, and
after removing the porous monocrystalline semiconductor layer, removing the etching prevention film.

* * * * *

UNITED STATES PATENT AND TRADEMARK OFFICE
CERTIFICATE OF CORRECTION

PATENT NO. : 5,840,616

DATED : November 24, 1998

INVENTOR(S): KIYOFUMI SAKAGUCHI ET AL.          Page 1 of 5

It is certified that error appears in the above-identified patent and that said Letters Patent is hereby corrected as shown below:

On the title page, item

[56] REFERENCES CITED

U.S. Patent Documents
    "Yamagachi et al." should read --Yamaguchi et al.--.

Foreign Patent Documents
    "342814" should read --3-42814--.
    "3109731" should read --3-109731--.
    "2206548" should read --3-206548--.
    "479209" should read --4-79209--.

Other Publications
    After "Vescan, et al.": "Of Of" should read --Of--.
    After "R.P. Holmstrom et al.": "*physics*" should
      read --*Physics*--.
    After "Takai, H. et al.": --Power" should read
      --Porous--.

COLUMN 1

Line 6, "Ser. No. 07/866,609" should read
      --Ser. No. 07/886,609--.

COLUMN 2

Line 43, "as" should read --an--.
    Line 45, "substrated," should read --substrate,--.
    Line 50, "further," should read --Further,--.

UNITED STATES PATENT AND TRADEMARK OFFICE
CERTIFICATE OF CORRECTION

PATENT NO. : 5,840,616

DATED : November 24, 1998

INVENTOR(S): KIYOFUMI SAKAGUCHI ET AL.

It is certified that error appears in the above-identified patent and that said Letters Patent is hereby corrected as shown below:

COLUMN 3

Line 48, "substrate" should read --substrates--.

COLUMN 4

Line 20, "invention." should read --invention;--.

COLUMN 7

Line 61, "(e)" should read --1(e)--.

COLUMN 9

Line 62, "view point" should read --viewpoint--.

COLUMN 10

Line 1, "(e)" should read --2(e)--.

COLUMN 11

Line 3, "view point" should read --viewpoint--.
   Line 5, "apitaxial" should read --epitaxial--.
   Line 9, "(d)" should read --3(d)--.
   Line 12, "following" should read --following explanation--.
   Line 18, "wholly" should read --entirely--.

UNITED STATES PATENT AND TRADEMARK OFFICE
CERTIFICATE OF CORRECTION

PATENT NO. : 5,840,616

DATED : November 24, 1998

INVENTOR(S): KIYOFUMI SAKAGUCHI ET AL.                Page 3 of 5

It is certified that error appears in the above-identified patent and that said Letters Patent is hereby corrected as shown below:

COLUMN 12

Line 49, "Si+20+Si $O_2$" should read --Si+20$\rightarrow$$SiO_2$--.

COLUMN 13

Line 9, "quite" should read --much--.
Line 16, "(e)" should read --4(e)--.

COLUMN 14

Line 16, "view point" should read --viewpoint--.

COLUMN 17

Line 56, "has dependencies" should read --depends--.

COLUMN 19

Line 1, "has dependencies" should read --depends--.
Line 16, "has dependencies" should read --depends--.
Line 20, "not" should be deleted.

COLUMN 20

Line 21, "has dependencies" should read --depends--.

UNITED STATES PATENT AND TRADEMARK OFFICE
CERTIFICATE OF CORRECTION

PATENT NO. : 5,840,616

DATED : November 24, 1998

INVENTOR(S) : KIYOFUMI SAKAGUCHI ET AL.          Page 4 of 5

It is certified that error appears in the above-identified patent and that said Letters Patent is hereby corrected as shown below:

COLUMN 21

Line 31, "has dependencies" should read --depends--.
    Line 50, "has dependencies" should read --depends--.

COLUMN 22

Line 63, "The" should read --¶ The--.

COLUMN 25

Line 32, "2.5 mn/sec" should read --2.5 nm/sec--.
    Line 47, "Then," should read --¶ Then,--.

COLUMN 27

Line 50, "was" should read --was used--.
    Line 63, "example" should read --(example--.

COLUMN 28

Line 5, "$SiH_2Cl_2$ $_{1000}$ $_{SCCM}$" should read
       --$SiH_2Cl_2$ 1000   SCCM--.
    Line 53, "760 Torr" should read --80 Torr--.

UNITED STATES PATENT AND TRADEMARK OFFICE
CERTIFICATE OF CORRECTION

PATENT NO. : 5,840,616

DATED : November 24, 1998

INVENTOR(S) : KIYOFUMI SAKAGUCHI ET AL.   Page 5 of 5

It is certified that error appears in the above-identified patent and that said Letters Patent is hereby corrected as shown below:

COLUMN 31

Line 36, "Anodization" should read --¶ Anodization--.

COLUMN 41

Line 2, "si" should read --Si--.

COLUMN 43

Line 25, "(EXAMPLES 72" should read --(EXAMPLES 73--.

COLUMN 44

Line 38, "porous." should read --porous. The conditions
      of the anodization are as follows.--.

Signed and Sealed this

First Day of February, 2000

Attest:

Q. TODD DICKINSON

*Attesting Officer*   *Acting Commissioner of Patents and Trademarks*